United States Patent
Fujitsuka et al.

(10) Patent No.: US 12,457,740 B2
(45) Date of Patent: Oct. 28, 2025

(54) SEMICONDUCTOR STORAGE DEVICE INCLUDING A LOW ON-RESISTANCE JOINT BETWEEN ARRAYS

(71) Applicant: Kioxia Corporation, Tokyo (JP)

(72) Inventors: Ryota Fujitsuka, Yokkaichi (JP); Ryota Suzuki, Yokkaichi (JP); Kenta Yamada, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 548 days.

(21) Appl. No.: 17/654,261

(22) Filed: Mar. 10, 2022

(65) Prior Publication Data

US 2023/0077151 A1    Mar. 9, 2023

(30) Foreign Application Priority Data

Sep. 9, 2021 (JP) .................. 2021-146848

(51) Int. Cl.
| | | |
|---|---|---|
| H10B 43/27 | (2023.01) | |
| H10B 41/10 | (2023.01) | |
| H10B 41/27 | (2023.01) | |
| H10B 41/35 | (2023.01) | |
| H10B 43/10 | (2023.01) | |
| H10B 43/35 | (2023.01) | |

(52) U.S. Cl.
CPC .......... *H10B 43/27* (2023.02); *H10B 41/10* (2023.02); *H10B 41/27* (2023.02); *H10B 41/35* (2023.02); *H10B 43/10* (2023.02); *H10B 43/35* (2023.02)

(58) Field of Classification Search
CPC .................. H10B 41/00–70; H10B 43/00–50
See application file for complete search history.

(56) References Cited

U.S. PATENT DOCUMENTS

| | | | |
|---|---|---|---|
| 10,879,261 B2 * | 12/2020 | Nagashima | ....... H01L 21/76816 |
| 10,957,702 B2 | 3/2021 | Oga et al. | |
| 10,985,175 B2 | 4/2021 | Nagashima | |
| 2017/0236835 A1 * | 8/2017 | Nakamura | .............. H01L 28/00 |
| | | | 257/314 |
| 2018/0182771 A1 | 6/2018 | Costa et al. | |
| 2018/0277567 A1 | 9/2018 | Nakamura et al. | |

FOREIGN PATENT DOCUMENTS

| | | |
|---|---|---|
| JP | 2020-035977 A | 3/2020 |
| JP | 2020-047754 A | 3/2020 |
| JP | 2020-047848 A | 3/2020 |

* cited by examiner

*Primary Examiner* — Christine S. Kim
*Assistant Examiner* — Tyler J Wiegand
(74) *Attorney, Agent, or Firm* — Oblon, McClelland, Maier & Neustadt, L.L.P.

(57) ABSTRACT

A semiconductor storage device includes a first stack including a plurality of first electrode films stacked in a first direction. A second stack is provided above the first stack and includes a plurality of second electrode films that are stacked in the first direction. A first column portion is provided in the first stack to extend in the first direction and includes a first charge storage film and a first semiconductor layer. A second column portion is provided in the second stack to extend in the first direction and includes a second charge storage film and a second semiconductor layer. A connecting portion is provided between the first column portion and the second column portion, divides the first charge storage film and the second charge storage film from each other, and is configured to electrically connect the first semiconductor layer and the second semiconductor layer to each other.

8 Claims, 21 Drawing Sheets

SEMICONDUCTOR STORAGE DEVICE INCLUDING A LOW ON-RESISTANCE JOINT BETWEEN ARRAYS

CROSS REFERENCE TO RELATED APPLICATIONS

This application is based upon and claims the benefit of priority from the prior Japanese Patent Application No. 2021-146848, filed on Sep. 9, 2021, the entire contents of which are incorporated herein by reference.

FIELD

The embodiments of the present invention relate to a semiconductor storage device and manufacturing method thereof.

BACKGROUND

A semiconductor device such as a NAND flash memory may include a three-dimensional memory cell array having a plurality of memory cells arranged three-dimensionally. The number of stacked layers in the three-dimensional memory cell array is increasing every year, and the memory cell array may be formed as separate arrays including a lower array and an upper array.

In a case of forming the memory cell array as the lower array and the upper array as described above, a channel semiconductor layer is relatively far from a word line in a connecting portion (a joint portion) between the lower array and the upper array and is therefore difficult to turn on. In this case, the on-resistance of the channel semiconductor layer in the joint portion is high, so that a cell current from the memory cell array is reduced.

DETAILED DESCRIPTION

Figure 1A:
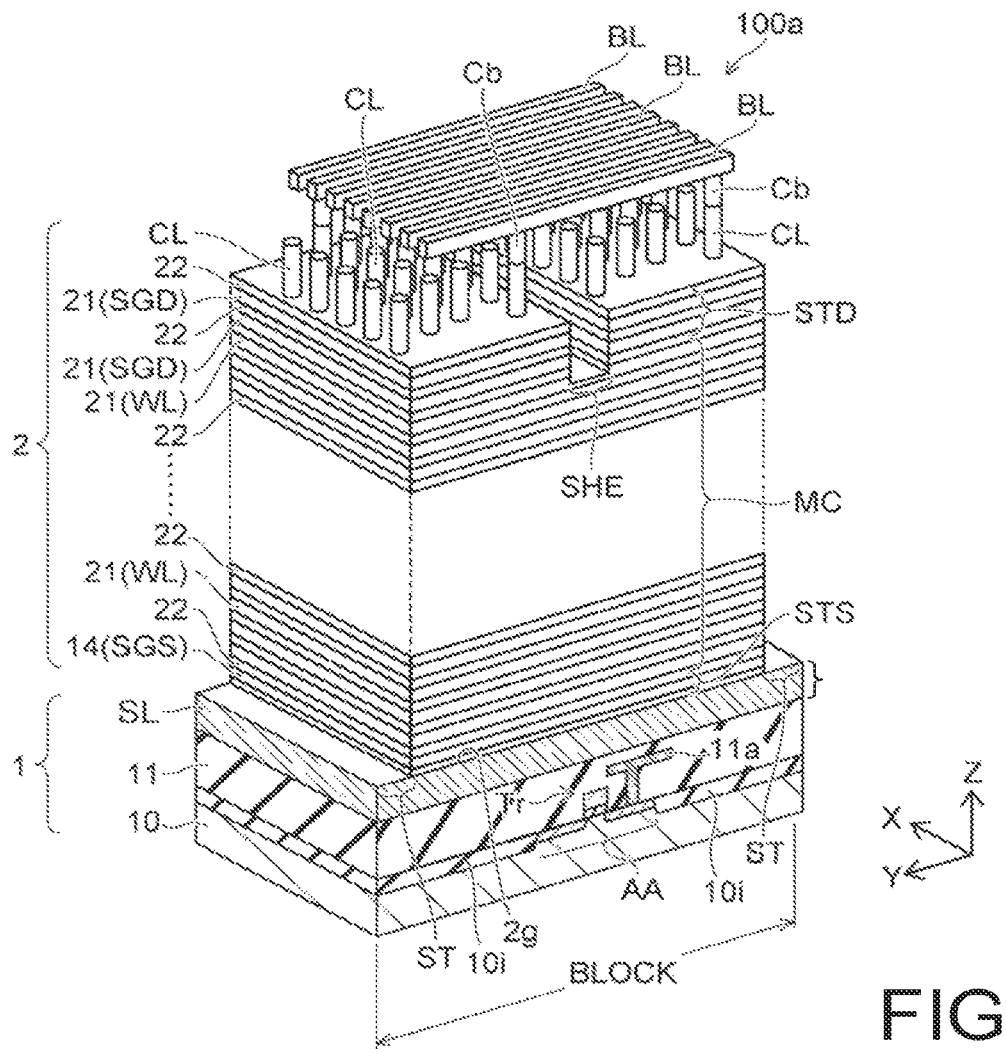
FIG. 1A is a schematic perspective view of an example of a semiconductor storage device 100a according to a first embodiment.

Embodiments will now be explained with reference to the accompanying drawings. The present invention is not limited to the embodiments. In the present specification and the drawings, elements identical to those described in the foregoing drawings are denoted by like reference characters and detailed explanations thereof are omitted as appropriate.

A semiconductor storage device according to the present embodiment includes a first stack including a plurality of first electrode films stacked in a first direction and electrically isolated from each other. A second stack is provided above the first stack and includes a plurality of second electrode films that are stacked in the first direction and are electrically isolated from each other. A first column portion is provided in the first stack to extend in the first direction and includes a first insulation film, a first charge storage film, a second insulation film, and a first semiconductor layer. A second column portion is provided in the second stack to extend in the first direction and includes a third insulation film, a second charge storage film, a fourth insulation film, and a second semiconductor layer. A connecting portion is provided between the first column portion and the second column portion, divides the first insulation film and the third insulation film from each other, the first charge storage film and the second charge storage film from each other, and the second insulation film and the fourth insulation film from each other all over the first and second column portions, and is configured to electrically connect the first semiconductor layer and the second semiconductor layer to each other.

First Embodiment

Figure 1B:
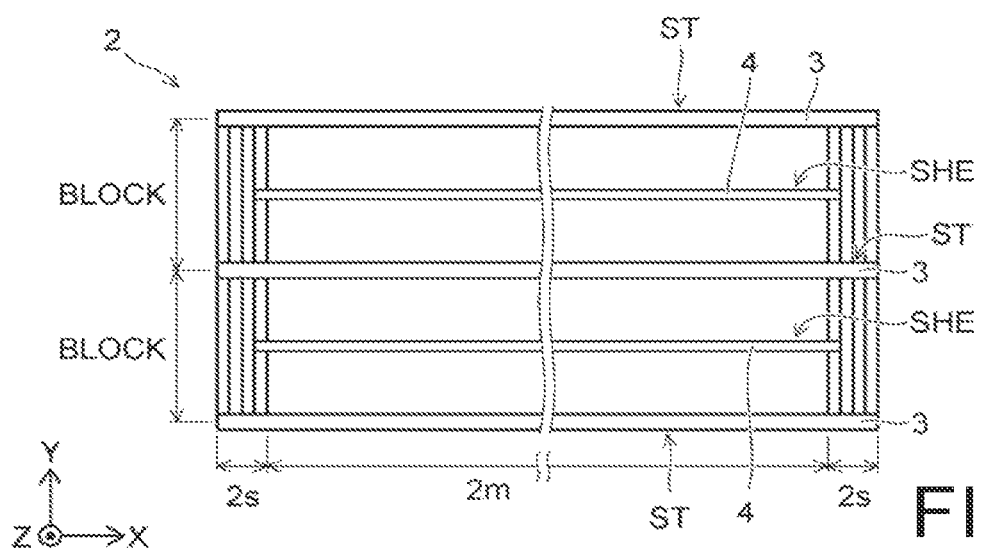
FIG. 1B is a schematic plan view of a stack 2 in FIG. 1A.
Figure 2A:
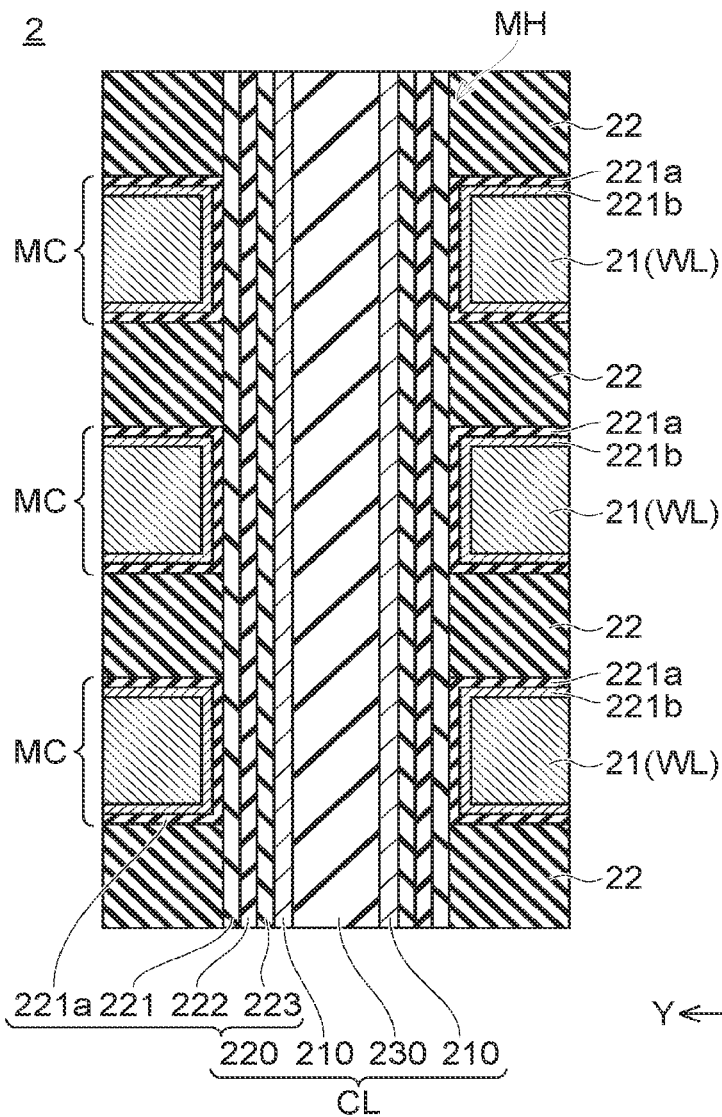
FIGS. 2A and 2B are schematic cross-sectional views of an example of a memory cell having a three-dimensional configuration.
Figure 2B:
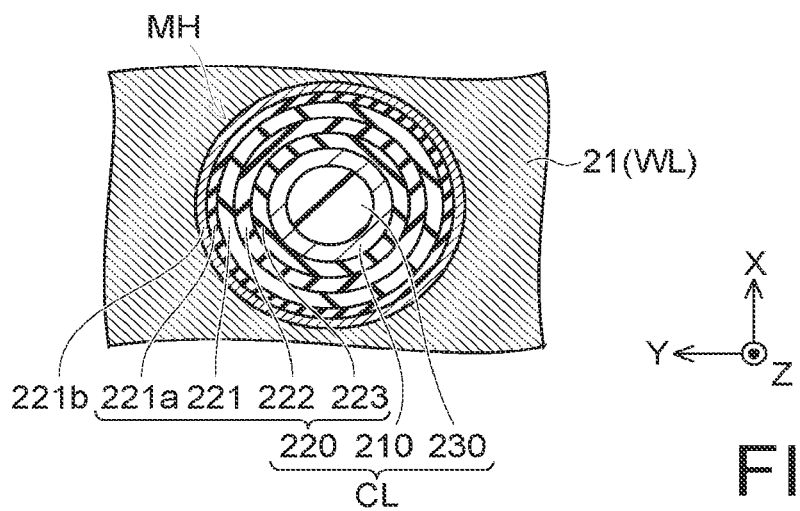
Figure 3:
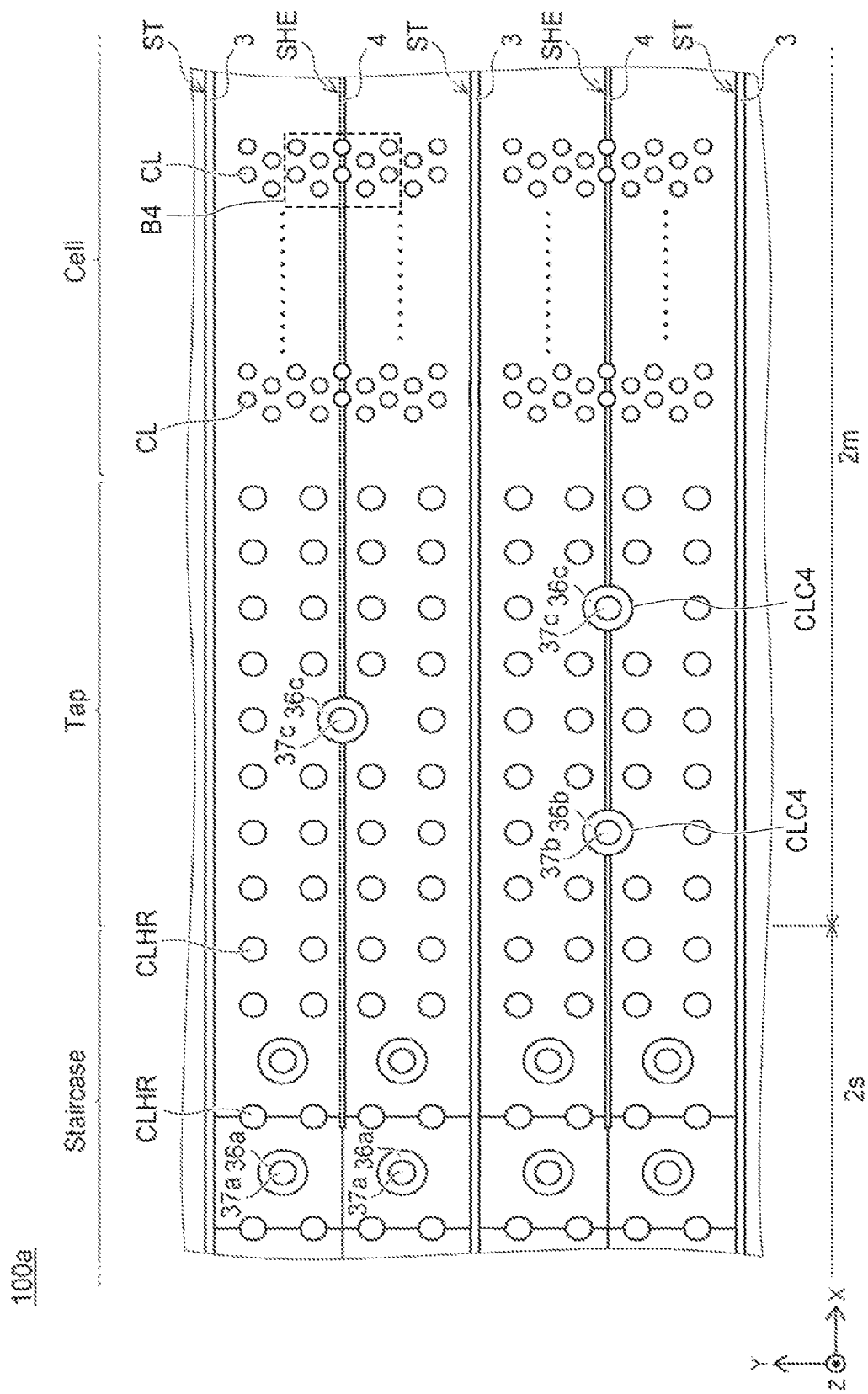
FIG. 3 is a schematic plan view of an example of the semiconductor storage device according to the first embodiment.

FIG. 1A is a schematic perspective view of an example of a semiconductor storage device 100a according to a first embodiment. FIG. 1B is a schematic plan view of a stack 2 in FIG. 1A. In the present specification, a stacking direction of the stack 2 is assumed as a Z-direction. One direction that crosses the Z-direction, for example, at right angles is assumed as a Y-direction. One direction that crosses the Z-direction and the Y-direction, for example, at right angles is assumed as an X-direction. FIGS. 2A and 2B are schematic cross-sectional views of an example of a memory cell having a three-dimensional configuration. FIG. 3 is a schematic plan view of an example of the semiconductor storage device according to the first embodiment.

As illustrated in FIG. 1A, the semiconductor storage device 100a according to the first embodiment is a nonvolatile memory including memory cells having a three-dimensional configuration.

The semiconductor storage device 100a includes a base portion 1, the stack 2, a deep slit ST (a plate-shaped portion 3 in FIG. 1B), a shallow slit SHE (a plate-shaped portion 4 in FIG. 1B), and a plurality of column portions CL.

The base portion 1 includes a substrate 10, an interlayer dielectric film 11, and a source layer SL. The interlayer dielectric film 11 is provided on the substrate 10. The source layer SL is provided on the interlayer dielectric film 11.

The substrate 10 is a semiconductor substrate, for example, a silicon substrate. The conductivity type of silicon (Si) is, for example, a p-type. An element isolation region 10i, for example, is provided in a surface region of the substrate 10. The element isolation region 10i is an insulating region that contains silicon oxide ($SiO_2$), for example, and defines an active area AA in the surface region of the substrate 10. Source and drain regions of a transistor Tr are provided in the active area AA. The transistor Tr configures a peripheral circuit (a CMOS (Complementary Metal Oxide Semiconductor) circuit) of the non-volatile memory. The CMOS circuit is provided below the source layer SL and on the substrate 10. The interlayer dielectric film 11 contains, for example, silicon oxide and covers the transistor Tr. A wire 11a is provided in the interlayer dielectric film 11. A portion of the wire 11a is electrically connected to the transistor Tr. For example, doped polysilicon or a conductive material such as tungsten (W) is used for the source layer SL. The source layer SL may be formed by a plurality of layers, and a portion thereof may contain undoped silicon. The source layer SL serves as a common source line of a memory cell array (2m in FIG. 1B).

The stack 2 is provided above the substrate 10 and is located in the Z-direction with respect to the source layer SL. The stack 2 is configured by a plurality of electrode films 21 and a plurality of insulation films 22 alternately stacked in the Z-direction. The electrode films 21 contain conductive metal such as tungsten. The insulation films 22 contain silicon oxide, for example. The insulation films 22 insulate the electrode films 21 from each other. The stacked number of each of the electrode films 21 and the insulation films 22 may be any number. The insulation film 22 may be an air gap, for example. An insulation film 2g, for example, is provided between the stack 2 and the source layer SL. The insulation film 2g contains silicon oxide, for example. The insulation film 2g may contain a high dielectric material having a relative permittivity higher than that of silicon oxide. The high dielectric material may be metal oxide, for example.

The electrode films 21 include at least one source-side selection gate SGS, a plurality of word lines WL, and at least one drain-side selection gate SGD. The source-side selection gate SGS is a gate electrode of a source-side selection transistor STS. The word line WL serves as gate electrodes of memory cells MC. The drain-side selection gate SGD is a gate electrode of a drain-side selection transistor STD. The source-side selection gate SGS is provided in a lower region of the stack 2. The drain-side selection gate SGD is provided in an upper region of the stack 2. The lower region is a region of the stack 2 closer to the base portion 1, and the upper region is a region of the stack 2 farther from the base portion 1. The word lines WL are provided between the source-side selection gate SGS and the drain-side selection gate SGD.

The thickness in the Z-direction of one of the insulation films 22 which insulates the source-side selection gate SGS and the word line WL from each other may be larger than, for example, the thickness in the Z-direction of the insulation film 22 that insulates the word lines WL from each other. Further, a cover insulation film (not illustrated) may be provided on the uppermost insulation film 22 that is the farthest from the base portion 1. The cover insulation film contains silicon oxide, for example.

The semiconductor storage device 100a includes the plural memory cells MC connected in series between the source-side selection transistor STS and the drain-side selection transistor STD. The configuration in which the source-side selection transistor STS, the memory cells MC, and the drain-side selection transistor STD are connected in series is called "memory string" or "NAND string". One memory string is connected to bit lines BL, for example, via contacts Cb. The bit lines BL are provided above the stack 2 and extend in the Y-direction.

The deep slits ST and the shallow slits SHE are provided in the stack 2. The deep slits ST extend in the X-direction and are provided in the stack 2 to penetrate through the stack 2 from the top end of the stack 2 to the base portion 1. The plate-shaped portion 3 is a wire provided in the deep slit ST. The plate-shaped portion 3 is formed by a conductive film that is electrically insulated from the stack 2 by an insulation film (not illustrated) provided on an inner wall of the deep slit ST, is embedded in the deep slit ST, and is electrically connected to the source layer SL. The plate-shaped portion 3 may be filled with an insulation material such as silicon oxide. Meanwhile, the shallow slits SHE extend in the X-direction and are provided from the top end of the stack 2 to the middle of the stack 2. The shallow slits SHE penetrate through the upper region of the stack 2 in which the drain-side selection gate SGD is provided. The plate-shaped portion 4, for example, is provided in the shallow slit SHE (FIG. 1B). The plate-shaped portion 4 is made of silicon oxide, for example.

As illustrated in FIG. 1B, the stack 2 includes staircase regions 2s and the memory cell array 2m. The staircase region 2s is provided at an edge of the stack 2. The memory cell array 2m is sandwiched between the staircase regions 2s or is surrounded by the staircase region 2s. The deep slit ST is provided from the staircase region 2s at one end of the stack 2 to the staircase region 2s at the other end of the stack 2 through the memory cell array 2m. The shallow slit SHE is provided at least in the memory cell array 2m.

As illustrated in FIG. 3, the memory cell array 2m includes a cell region (Cell) and a tap region (Tap). The staircase region 2s includes a staircase region (Staircase). The tap region is provided, for example, between the cell region and the staircase region. Although not illustrated in FIG. 3, the tap region may be provided between the cell regions. The staircase region is a region where a plurality of wires 37a are provided. The tap region is a region where wires 37b and 37c are provided. The wires 37a to 37c extend in the Z-direction, for example. Each of the wires 37a is electrically connected to the electrode film 21, for example. The wire 37b is electrically connected to the source layer SL, for example. The wire 37c is electrically connected to the wire 11a, for example.

A portion of the stack 2 sandwiched between the two plate-shaped portions 3 illustrated in FIG. 1B is called "block (BLOCK)". The block is the minimum unit for erasing data, for example. The plate-shaped portion 4 is provided in the block. The stack 2 between the plate-shaped portion 3 and the plate-shaped portion 4 is called "finger". The drain-side selection gate SGD is divided for each finger. Therefore, in data writing and data reading, it is possible to place one finger in a block in a selected state by the drain-side selection gate SGD.

As illustrated in FIG. 2A, each of the column portions CL is provided in a memory hole MH formed in the stack 2. Each column portion CL penetrates through the stack 2 from the top end of the stack 2 in the Z-direction and is provided in the stack 2 and in the source layer SL. Each of the column portions CL includes a semiconductor body 210, a memory film 220, and a core layer 230. The column portion CL includes the core layer 230 provided at its center, the semiconductor body 210 provided around the core layer 230, and the memory film 220 provided around the semiconductor body 210. The semiconductor body 210 is electrically connected to the source layer SL. The memory film 220 as a charge storage member has a charge trapping portion between the semiconductor body 210 and the electrode film 21. The column portions CL selected one by one from the respective fingers are connected to one bit line BL in common via the contacts Cb. Each of the column portions CL is provided in the cell region (Cell), for example (FIG. 3).

The shape of the memory hole MH as viewed from an X-Y plane is, for example, substantially circular or substantially elliptical, as illustrated in FIG. 2B. A block insulation film 221a that configures a portion of the memory film 220 may be provided between the electrode film 21 and the insulation film 22. The block insulation film 221a is, for example, a silicon oxide film or a metal oxide film. One example of the metal oxide is aluminum oxide. A barrier film 221b may be provided between the electrode film 21 and the insulation film 22 and between the electrode film 21 and the memory film 220. In a case where the electrode film 21 is made of tungsten, for example, titanium nitride, for example, is selected as the barrier film 221b. The block insulation film 221a prevents back tunneling of electric charges from the electrode film 21 toward the memory film 220. The barrier film 221b improves adhesion between the electrode film 21 and the block insulation film 221a.

The shape of the semiconductor body 210 is tubular with a bottom, for example. The semiconductor body 210 contains silicon, for example. Silicon contained here is polysilicon obtained by crystallizing amorphous silicon, for example. The semiconductor body 210 is made of, for example, undoped silicon. The semiconductor body 210 may be made of p-type silicon. The semiconductor body 210 serves as a channel of each of the drain-side selection transistor STD, the memory cell MC, and the source-side selection transistor STS.

A portion of the memory film 220 other than the block insulation film 221a is provided between the inner wall of the memory hole MH and the semiconductor body 210. The shape of the memory film 220 is tubular, for example. The memory cells MC each include a storage region between the semiconductor body 210 and the electrode film 21 serving as the word line WL and are stacked in the Z-direction. The memory film 220 includes, for example, a cover insulation film 221, a charge storage film 222, and a tunnel insulation film 223. The semiconductor body 210, the cover insulation film 221, the charge storage film 222, and the tunnel insulation film 223 extend in the Z-direction.

The cover insulation film 221 is provided between the insulation film 22 and the charge storage film 222, and between the block insulation film 221a and the charge storage film 222. The cover insulation film 221 contains silicon oxide, for example. The cover insulation film 221 protects the charge storage film 222 from being etched when a sacrifice film (not illustrated) is replaced with the electrode film 21 (in a replacement process).

The charge storage film 222 is provided between the block insulation film 221a and the cover insulation film 221, and the tunnel insulation film 223. The charge storage film 222 contains, for example, silicon nitride and includes trap sites that trap therein electric charges. A portion of the charge storage film 222 which is sandwiched between the electrode film 21 serving as the word line WL and the semiconductor body 210 configures the storage region of the memory cell MC as a charge trapping portion. A threshold voltage of the memory cell MC is changed depending on whether electric charges are present in the charge trapping portion or in accordance with the amount of electric charges trapped in the charge trapping portion. Accordingly, the memory cell MC retains information.

The tunnel insulation film 223 is provided between the semiconductor body 210 and the charge storage film 222. The tunnel insulation film 223 contains silicon oxide, or silicon oxide and silicon nitride, for example. The tunnel insulation film 223 is a potential barrier between the semiconductor body 210 and the charge storage film 222. For example, when electrons are injected from the semiconductor body 210 to the charge trapping portion (in a write operation) and when holes are injected from the semiconductor body 210 to the charge trapping portion (in an erase operation), the electrons and the holes each pass (tunnel) through the potential barrier formed by the tunnel insulation film 223.

The core layer 230 is embedded in a space within the tubular semiconductor body 210. The shape of the core layer 230 is columnar, for example. The core layer 230 contains silicon oxide, for example, and is insulative.

Each of column portions CLHR in FIG. 3 is provided in a hole formed in the stack 2. The hole penetrates through the stack 2 from the top end of the stack 2 in the Z-direction and is provided in the stack 2 and in the source layer SL. Each of the column portions CLHR contains at least an insulator. The insulator is silicon oxide, for example. Each of the column portions CLHR may have the same configuration as the column portion CL. Each of the column portions CLHR is provided in the staircase region (Staircase) and the tap region (Tap), for example. The column portions CLHR serve as support members for maintaining gaps formed in the staircase region and the tap region when a sacrifice film (not illustrated) is replaced with the electrode film 21 (in a replacement process). A plurality of column portions CLC4 are provided in the tap region (Tap) of the stack 2. Each column portion CLC4 includes the wire 37b or 37c. The wire 37b is electrically insulated from the stack 2 by an insulator 36b. The wire 37b is electrically connected to the source layer SL. The wire 37c is electrically insulated from the stack 2 by an insulator 36c. The wire 37c is electrically connected to any of the wires 11a. The staircase region (Staircase) further includes the wire 37a serving as a contact with the electrode film 21 in the stack 2 and an insulator 36a provided around the wire 37a.

The column portions CL, that is, the memory holes MH are arranged in hexagonal close packing between two of the deep slits ST adjacent to each other in the Y-direction in a planar layout. The shallow slits SHE are provided to overlap some of the column portions CL, as illustrated in a frame B4 in FIG. 3. No memory cell is formed in the column portion CL under the shallow slit SHE.

This three-dimensional memory cell array 2m may be formed by a plurality of separate steps, as the number of stacked layers increases. This is because it becomes more difficult to form the memory hole MH in a desired shape, as a stack in the memory cell array 2m becomes thicker. For example, as illustrated in FIG. 4, the memory cell array 2m may be formed as two separate stacks including a lower array L2m and an upper array U2m.

Figure 4:
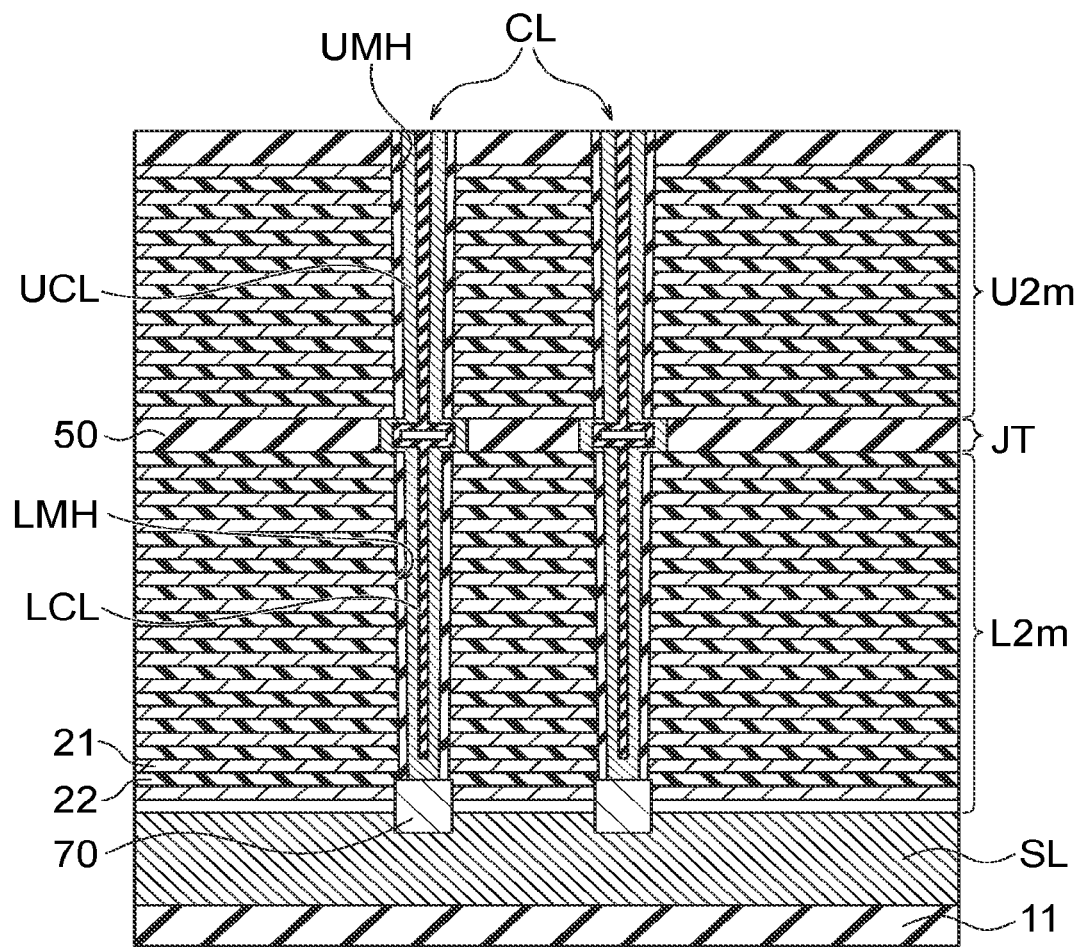
FIG. 4 is a cross-sectional view illustrating an example of a more detailed configuration of the stack.

FIG. 4 is a cross-sectional view illustrating an example of a more detailed configuration of the stack 2. The memory cell array 2m includes the lower array L2m and the upper array U2m.

The lower array L2m as a first stack is provided on the source layer SL. The lower array L2m is electrically connected to the source layer SL via an epitaxial silicon layer 70. In a case where the source layer SL is made of silicon single crystal, the epitaxial silicon layer 70 can be made to grow on the source layer SL. The upper array U2m as a second stack is provided above the lower array L2m. The lower array L2m and the upper array U2m each include the electrode films 21 and the insulation films 22 alternately stacked in the Z-direction. The electrode films 21 adjacent to each other in the Z-direction are electrically isolated from each other by the insulation film 22. Each insulation film 22 is provided between the electrode films 21 adjacent to each other in the Z-direction to electrically isolate these electrode films 21 from each other.

The column portions CL are provided in the upper array U2m and the lower array L2m of the memory cell array 2m to extend in the Z-direction. Each column portion CL includes a lower column portion LCL and an upper column portion UCL. The lower column portion LCL is provided in the lower array L2m to extend in the Z-direction, penetrates through the lower array L2m, and reaches the source layer SL. The upper column portion UCL is provided in the upper array U2m to extend in the Z-direction and penetrates through the upper array U2m. The upper column portion UCL and the lower column portion LCL each have the configuration described with reference to FIGS. 2A and 2B. Therefore, the upper column portion UCL includes the memory film 220, the semiconductor body 210, and the core layer 230 illustrated in FIGS. 2A and 2B in an upper memory hole UMH. The lower column portion LCL includes the memory film 220, the semiconductor body 210, and the core layer 230 illustrated in FIGS. 2A and 2B in a lower memory hole LMH.

An intermediate film 50 as a sixth insulation film is provided in a joint portion JT between the upper array U2m and the lower array L2m. An insulation film, for example, a silicon oxide film is used as the intermediate film 50.

Figure 5:
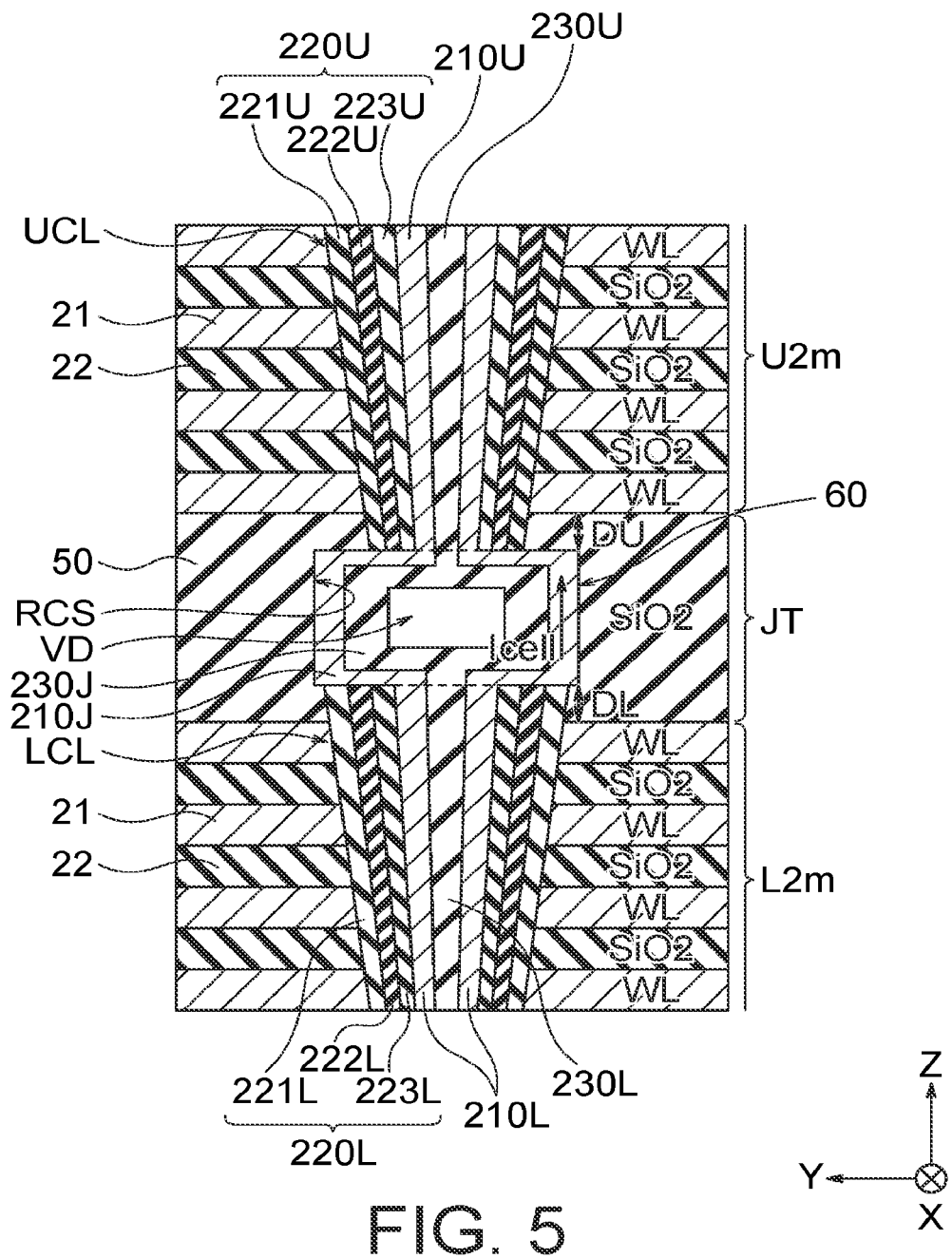
FIG. 5 is a cross-sectional view illustrating a configuration example of the joint portion between the upper array and the lower array.

FIG. 5 is a cross-sectional view illustrating a configuration example of the joint portion JT between the upper array U2m and the lower array L2m. The memory film 220, the semiconductor body 210, and the core layer 230 of the upper column portion UCL are called a memory film 220U, a semiconductor body 210U, and a core layer 230U for the sake of convenience. The memory film 220, the semiconductor body 210, and the core layer 230 of the lower column portion LCL are called a memory film 220L, a semiconductor body 210L, and a core layer 230L for the sake of convenience. Further, the semiconductor body 210 and the core layer 230 of the joint portion JT are called a semiconductor body 210J and a core layer 230J for the sake of convenience.

The intermediate film 50 is provided in the joint portion JT between the upper array U2m and the lower array L2m. An insulation film, for example, a silicon oxide film is used as the intermediate film 50.

The intermediate film 50 is set back in a direction in which it moves away from the center of the column portion CL (in the X-direction and/or the Y-direction). That is, the intermediate film 50 is recessed in the X direction and/or the Y-direction with respect to the upper array U2m and the lower array L2m to form a recessed portion RCS in the joint portion JT.

The semiconductor body 210J and the core layer 230J are embedded in the recessed portion RCS to form a connecting portion 60. The connecting portion 60 is provided between the upper column portion UCL and the lower column portion LCL. The connecting portion 60 divides a cover insulation film 221U and a cover insulation film 221L from each other, a charge storage film 222U and a charge storage film 222L from each other, and a tunnel insulation film 223U and a tunnel insulation film 223L from each other all over the upper column portion UCL and the lower column portion LCL (over the entire periphery). That is, the connecting portion 60 divides the memory film 220U and the memory film 220L from each other between the upper column portion UCL and the lower column portion LCL.

The semiconductor body 210J is located between the semiconductor body 210U and the semiconductor body 210L to be continuous therewith and electrically connect them to each other. In the present embodiment, the semiconductor bodies 210U, 210J, and 210L are formed by one semiconductor layer (for example, a doped silicon layer) in the upper column portion UCL, the connecting portion 60, and the lower column portion LCL. The semiconductor layer is bent in the X-direction or the Y-direction to be convex and divides the memory film 220U and the memory film 220L from each other. That is, the semiconductor body 210J and the core layer 230J project in the X-direction or the Y-direction in the intermediate film 50. As described above, because of the shape of the connecting portion 60, the memory film 220 is not provided in the connecting portion 60 of the joint portion JT.

The core layer 230J as a fifth insulation film is provided inside the semiconductor body 210J. The core layer 230J is provided along the inner surface of the semiconductor body 210J and has a void VD as a cavity therein.

According to the present embodiment, the memory film 220 is not provided around the connecting portion 60 in the joint portion JT. Therefore, the semiconductor body 210J of the connecting portion 60 is in direct contact with the intermediate film 50. In many portions of the connecting portion 60, only the intermediate film 50 (for example, a silicon oxide film) is interposed between the semiconductor body 210J and the word line WL.

Since the memory film 220 is not provided around the connecting portion 60, a distance DL from the semiconductor body 210J to the uppermost word line WL of the lower array L2m and a distance DU from the semiconductor body 210J to the lowermost word line WL of the upper array U2m become relatively short. That is, an insulation film interposed between each of the word lines WL of the lower array L2m and the upper array U2m and the semiconductor body 210J of the connecting portion 60 becomes thin, so that an electrostatic capacitance between the word line WL and the semiconductor body 210J becomes large. Accordingly, carriers can be easily induced in the semiconductor body 210J by a potential in the word line WL.

In a case where a surrounding portion of the connecting portion 60 is covered with the memory film 220, the memory film 220 is inevitably interposed between the semiconductor body 210J and the word line WL. Therefore, an electric field of the word line WL is less likely to be applied to the semiconductor body 210J from a viewpoint of relative permittivity. Further, in this case, the distance between the semiconductor body 210J and the word line WL becomes large, and therefore the electric field of the word line WL is less likely to be applied to the semiconductor body 210J.

On the other hand, according to the present embodiment, the memory film 220 is not provided around the connecting portion 60. Therefore, the electric field can be applied from the word line WL relatively easily. Accordingly, when an on-voltage is applied to the word line WL, the semiconductor body 210J can be inverted easily, so that the on-resistance is lowered. As a result, the on-resistance in the joint portion JT becomes low, allowing a cell current Icell to flow easily. Therefore, it is possible to correctly detect data of the memory cell MC.

Next, a manufacturing method of the semiconductor storage device 100a according to the first embodiment is described.

FIGS. 6 to 15 are cross-sectional views illustrating an example of the manufacturing method of the semiconductor storage device 100a according to the first embodiment. The base portion 1 illustrated in FIG. 1 is formed. First, the transistor Tr (a CMOS circuit) is formed on the substrate 10 and is covered with the interlayer dielectric film 11. The wire 11a is formed in the interlayer dielectric film 11. The source layer SL is formed on the interlayer dielectric film 11.

Next, a plurality of sacrifice films 21a and the insulation films 22 are alternately stacked in the Z-direction above the base portion 1. In this manner, a stack L2m of the sacrifice films 21a and the insulation films 22 is formed in a region of the lower array L2m. An insulating material, for example, silicon nitride is used for the sacrifice film 21a. An insulating material, for example, silicon oxide, is used for the insulation film 22. The sacrifice films 21a as first layers are stacked in the Z-direction and are separated from each other by the insulation films 22. The sacrifice films 21a are to be replaced with the electrode films 21 in a later process.

Next, the intermediate film 50 as the sixth insulation film is formed on the stack L2m. For example, a silicon oxide film is used as the intermediate film 50.

Next, the lower memory hole LMH is formed in the intermediate film 50 and the stack L2m to extend in the Z-direction and penetrate through the stack L2m by lithography and RIE (Reactive Ion Etching), for example. In a case where the source layer SL is made of silicon single crystal, the epitaxial silicon layer 70 can be made to grow on the source layer SL. In a case where the source layer SL is made of another conductive material, the epitaxial silicon layer 70 can be omitted. The structure of connecting the source layer SL and the lower memory hole LMH is not limited thereto and may be any other structure.

Next, the epitaxial silicon layer 70 is formed at the bottom portion of the lower memory hole LMH. The epitaxial silicon layer 70 is a silicon layer containing high concentration impurities and is electrically connected to the source layer SL.

Figure 6:
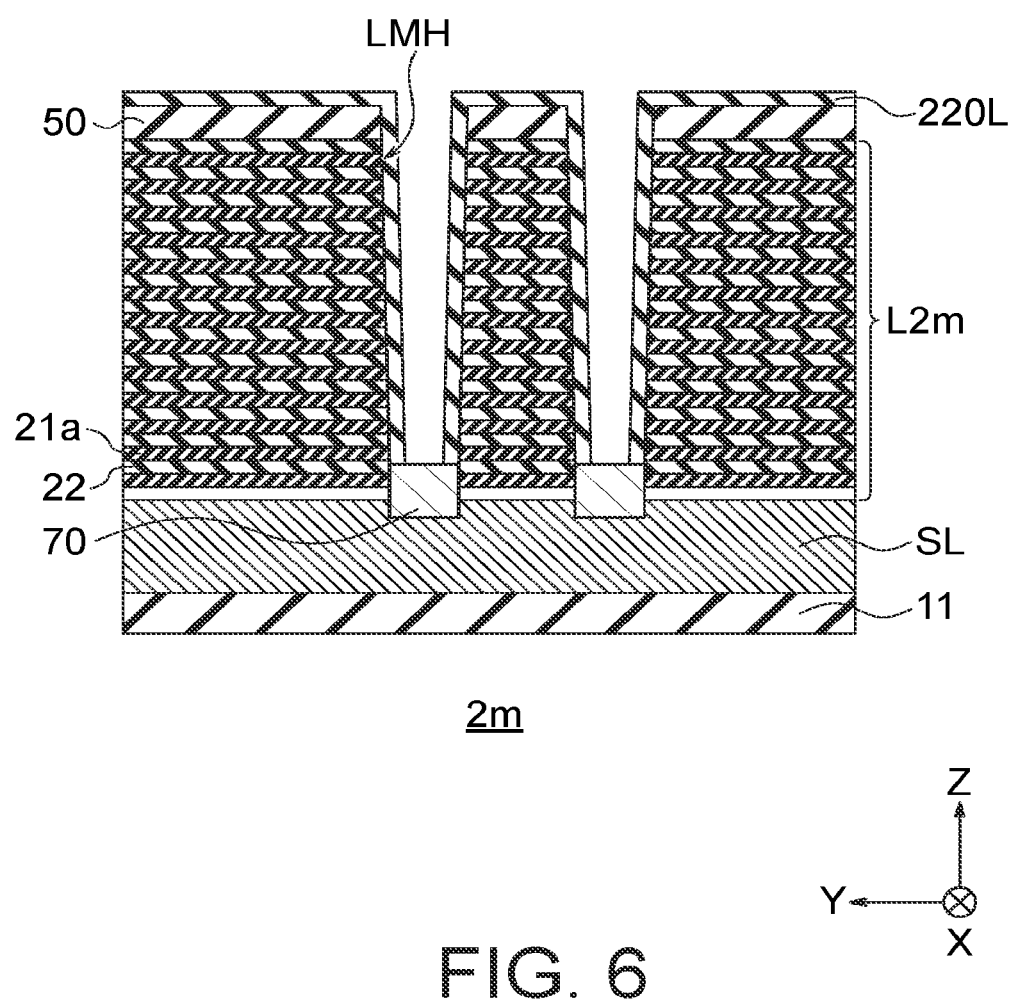
FIGS. 6 to 15 are cross-sectional views illustrating an example of the manufacturing method of the semiconductor storage device according to the first embodiment.

Next, the memory film 220L is formed on the inner wall of the lower memory hole LMH. For example, the cover insulation film 221L, the charge storage film 222L, and the tunnel insulation film 223L are deposited on the inner wall of the lower memory hole LMH in this order. Subsequently, the memory film 220L at the bottom portion of the lower memory hole LMH is removed with the memory film 220L on the side wall of the lower memory hole LMH left. The structure illustrated in FIG. 6 is obtained in this manner.

Figure 7:
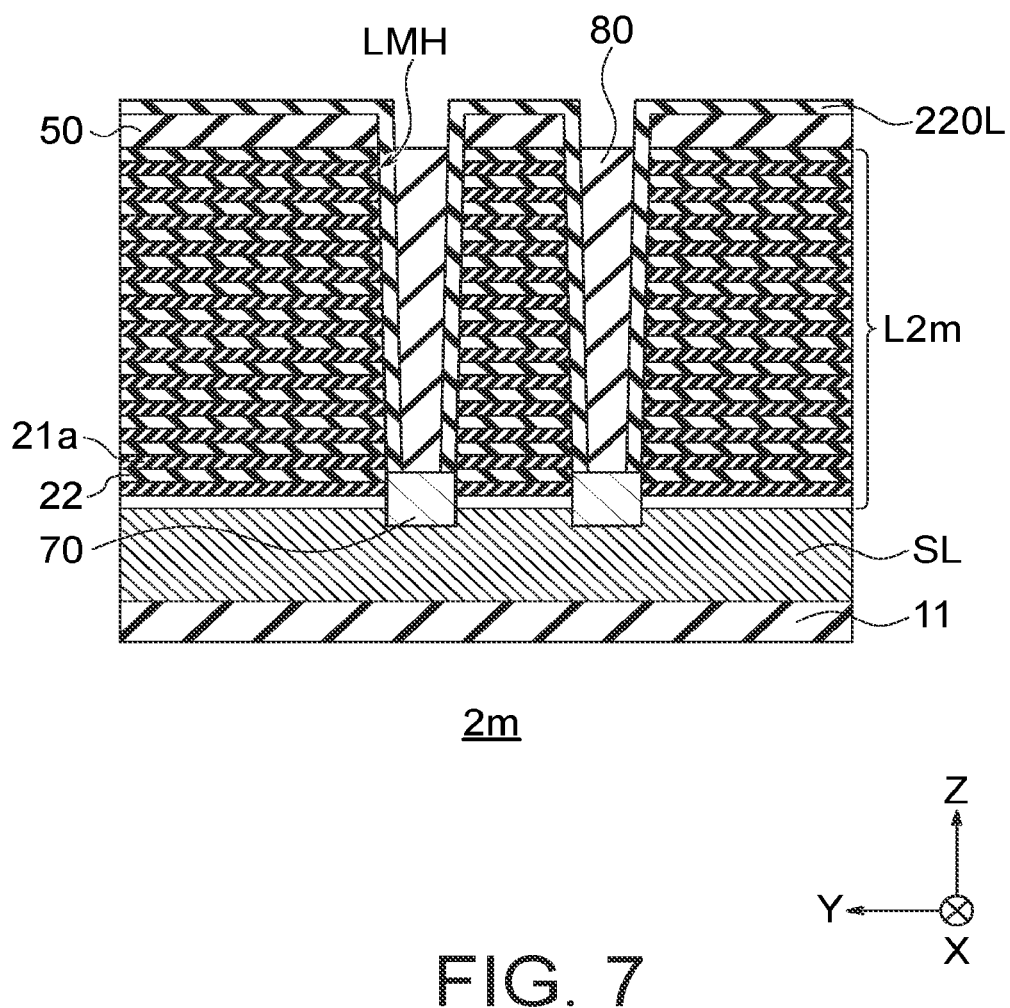

Next, as illustrated in FIG. 7, a sacrifice film 80 is embedded in the lower memory hole LMH. A material that can be selectively etched with respect to a silicon nitride film, a silicon oxide film, and a silicon film, for example, carbon or titanium nitride is used for the sacrifice insulation film 80. The sacrifice film 80 is etched back in such a manner that its top surface approaches the height position of the top surface of the stack L2m or the bottom surface of the intermediate film 50.

Figure 8:
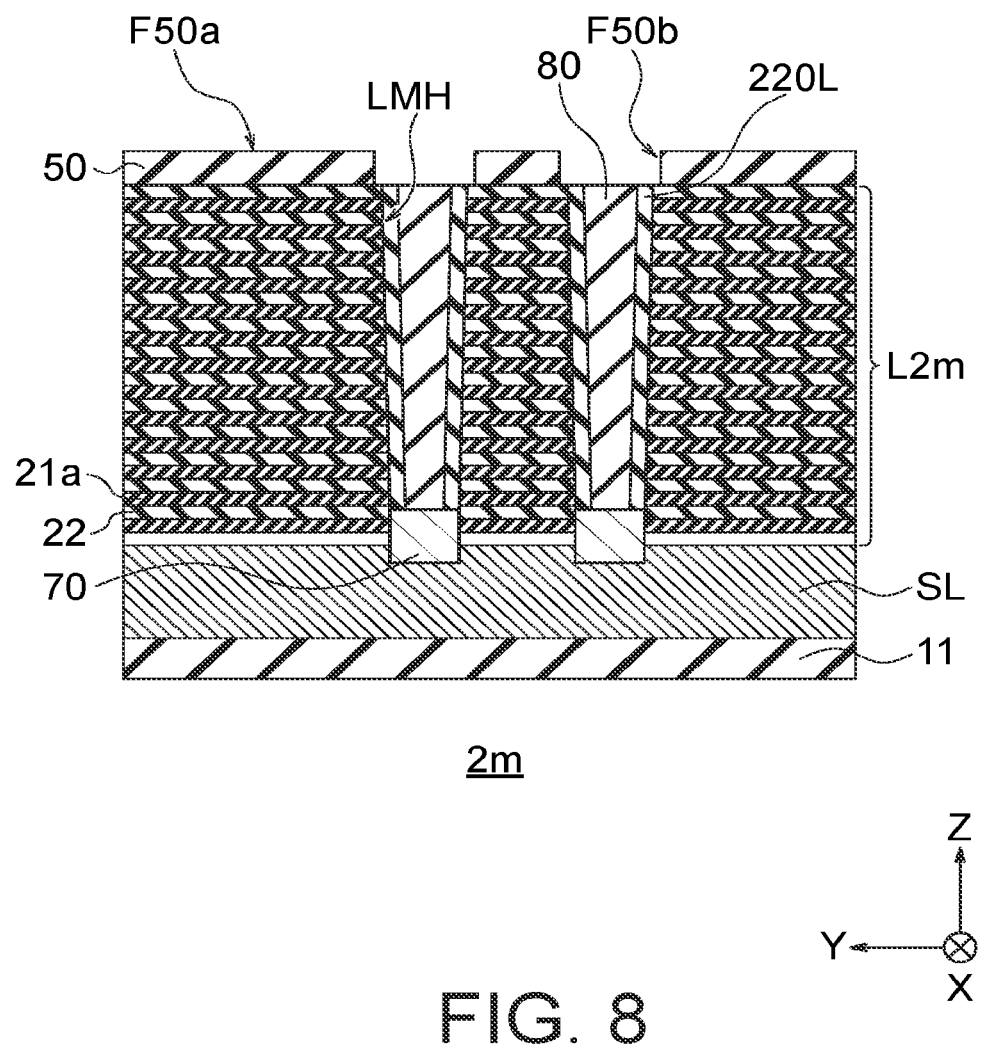

Next, as illustrated in FIG. 8, the memory film 220L is etched by using the sacrifice film 80 as a mask. Accordingly, the memory film 220 exposed on a top surface F50a and a side surface F50b of the intermediate film 50 is removed. The memory film 220 in the lower memory hole LMH of the stack L2m is left. As described above, the memory film 220L is not provided on the side surface F50b of the intermediate film 50.

Figure 9:
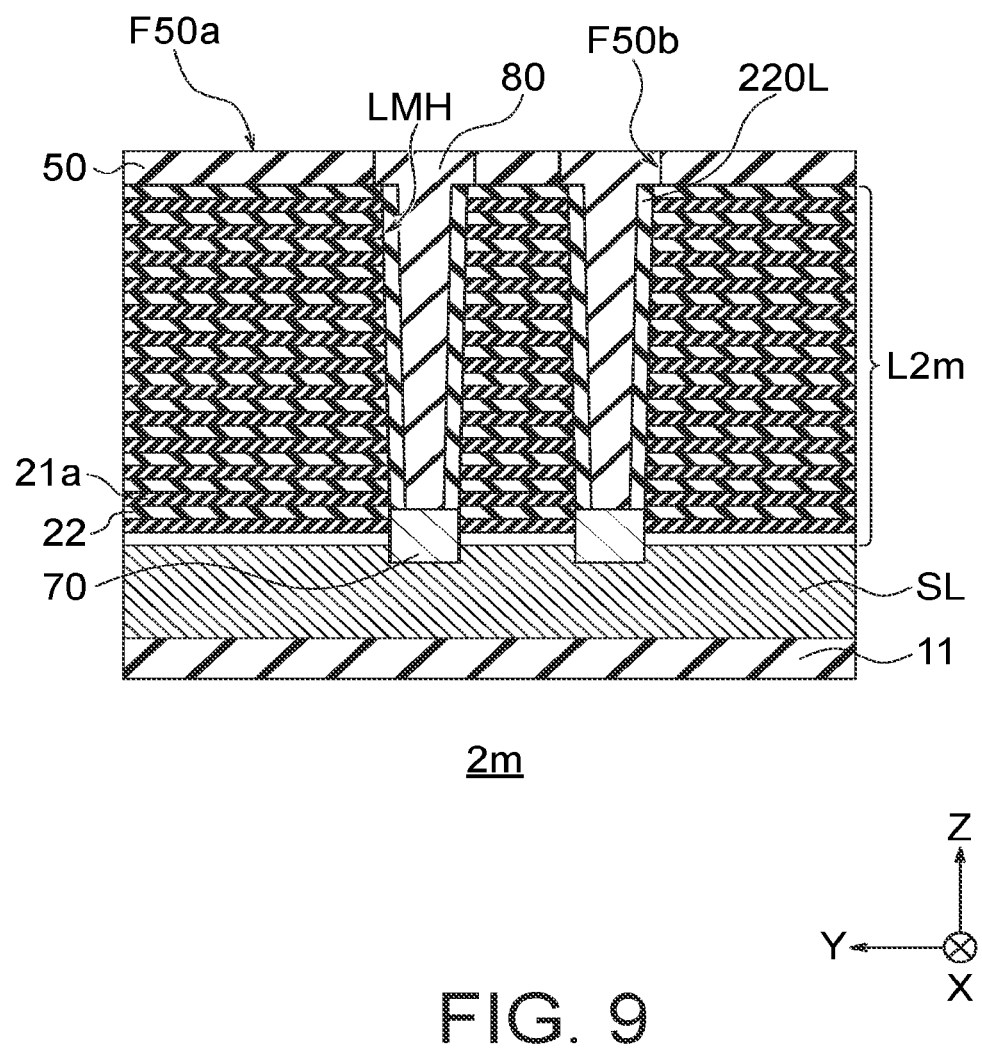

Next, as illustrated in FIG. 9, the sacrifice film 80 is embedded again in the lower memory hole LMH of the intermediate film 50. The sacrifice film 80 is polished until the top surface F50a of the intermediate film 50 is exposed. Accordingly, the sacrifice film 80 is in direct contact with the side surface F50b of the intermediate film 50, and the memory film 220L is not interposed between the sacrifice film 80 and the intermediate film 50.

Figure 10:
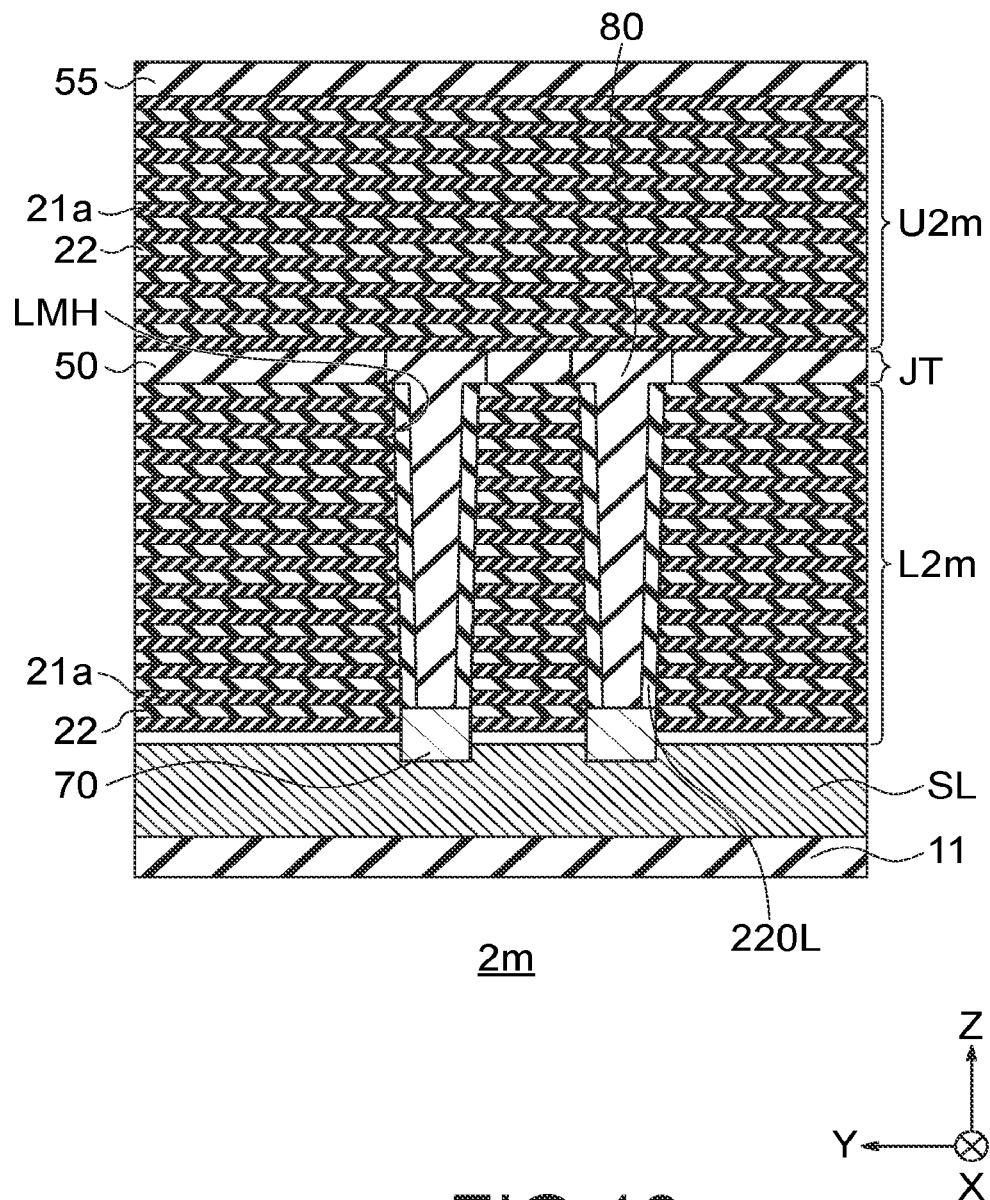

Next, the sacrifice films 21a and the insulation films 22 are alternately stacked in the Z-direction on the intermediate film 50. Accordingly, as illustrated in FIG. 10, a stack U2m of the sacrifice films 21a and the insulation films 22 is formed in a region of the upper array U2m. The sacrifice films 21a and the insulation films 22 of the stack U2m may be made of the same materials as the sacrifice films 21a and the insulation films 22 of the stack L2m, respectively. The sacrifice films 21a as second layers are stacked in the Z-direction and are separated from each other by the insulation films 22. The sacrifice films 21a are to be replaced with the electrode films 21 in a later process.

Next, an insulation film 55 is formed on the stack U2m.

Figure 11:
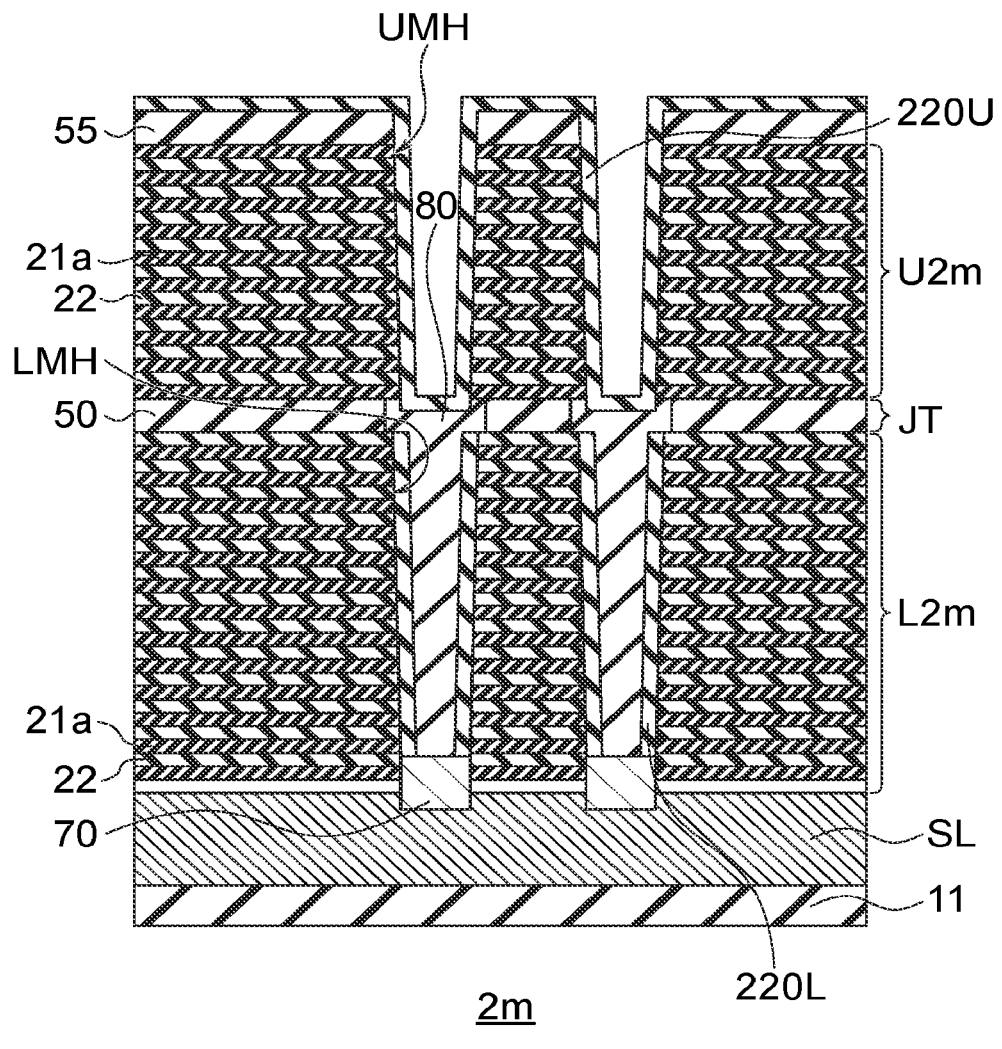

Next, as illustrated in FIG. 11, the upper memory hole UMH is formed in the insulation film 55 and the stack U2m to extend in the Z-direction and penetrate through the stack U2m by, for example, lithography and RIE. The upper memory hole UMH is formed to reach the sacrifice film 80.

Next, the memory film 220U is formed on the inner wall of the upper memory hole UMH. For example, the cover insulation film 221U, the charge storage film 222U, and the tunnel insulation film 223U are deposited on the inner wall of the upper memory hole UMH in this order. The structure illustrated in FIG. 11 is obtained in this manner.

Figure 12:
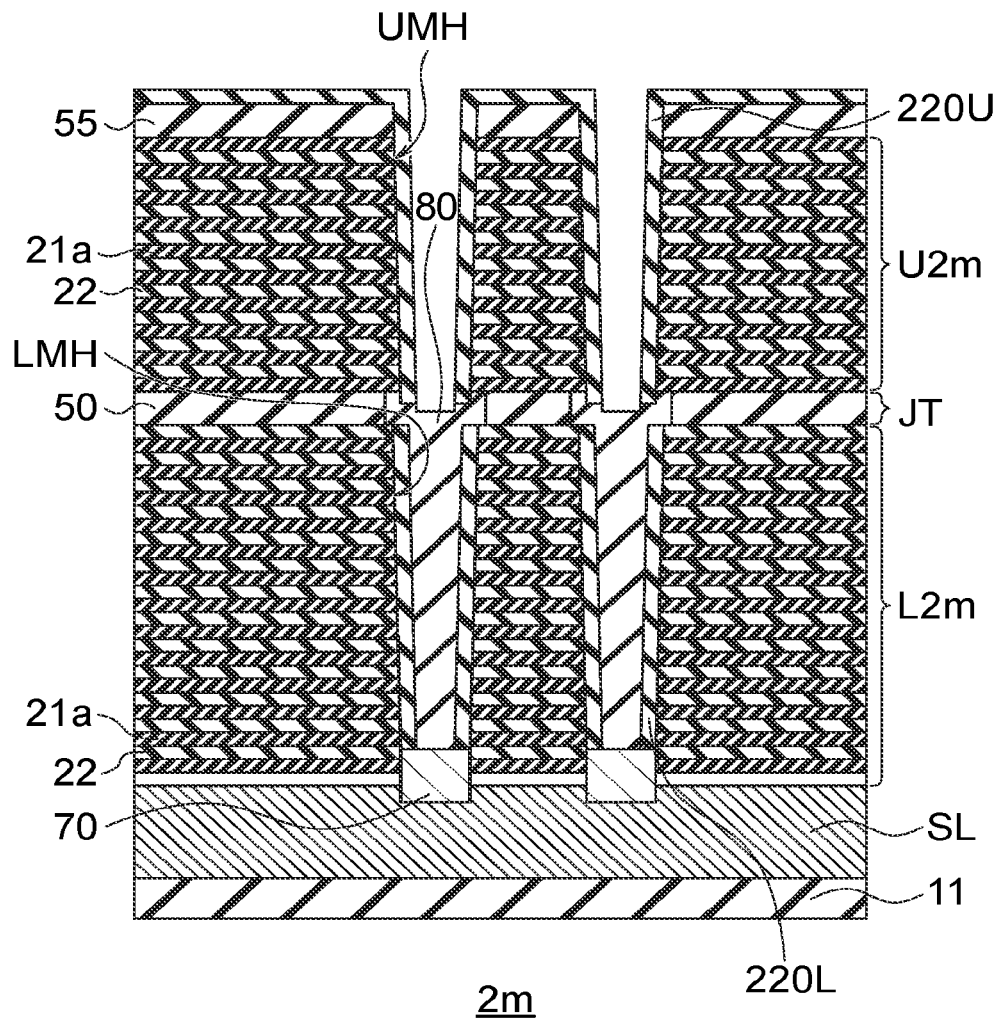

Next, as illustrated in FIG. 12, the memory film 220U is etched back, whereby the memory film 220U at the bottom portion of the upper memory hole UMH is removed with the memory film 220U on the side wall of the upper memory hole UMH left.

Figure 13:
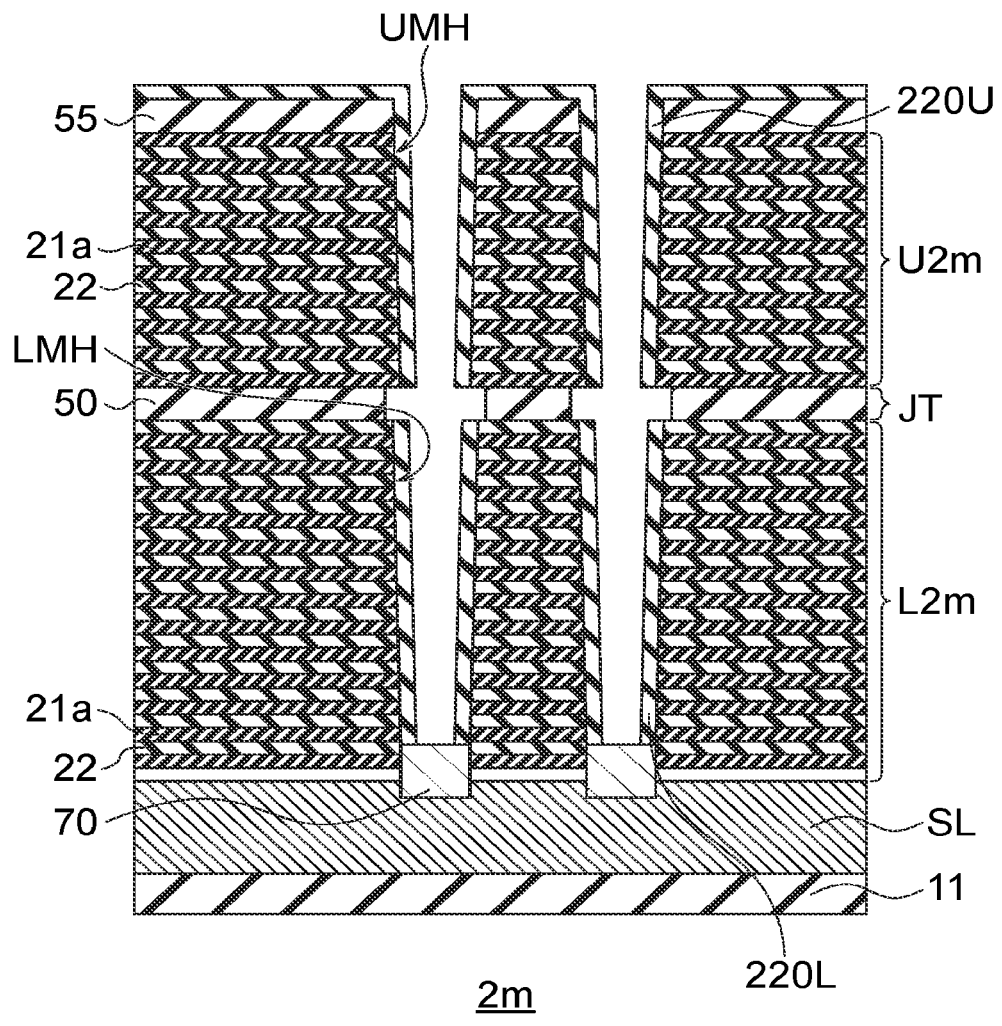

Next, as illustrated in FIG. 13, the sacrifice film 80 in the lower memory hole LMH and the intermediate film 50 is removed via the upper memory hole UMH. With this process, the upper memory hole UMH and the lower memory hole LMH communicate with each other through a hole in the intermediate film 50 in the joint portion JT. At this time, the memory films 220L and 220U are not formed on the side surface of the lower memory hole LMH in the intermediate film 50.

Figure 14:
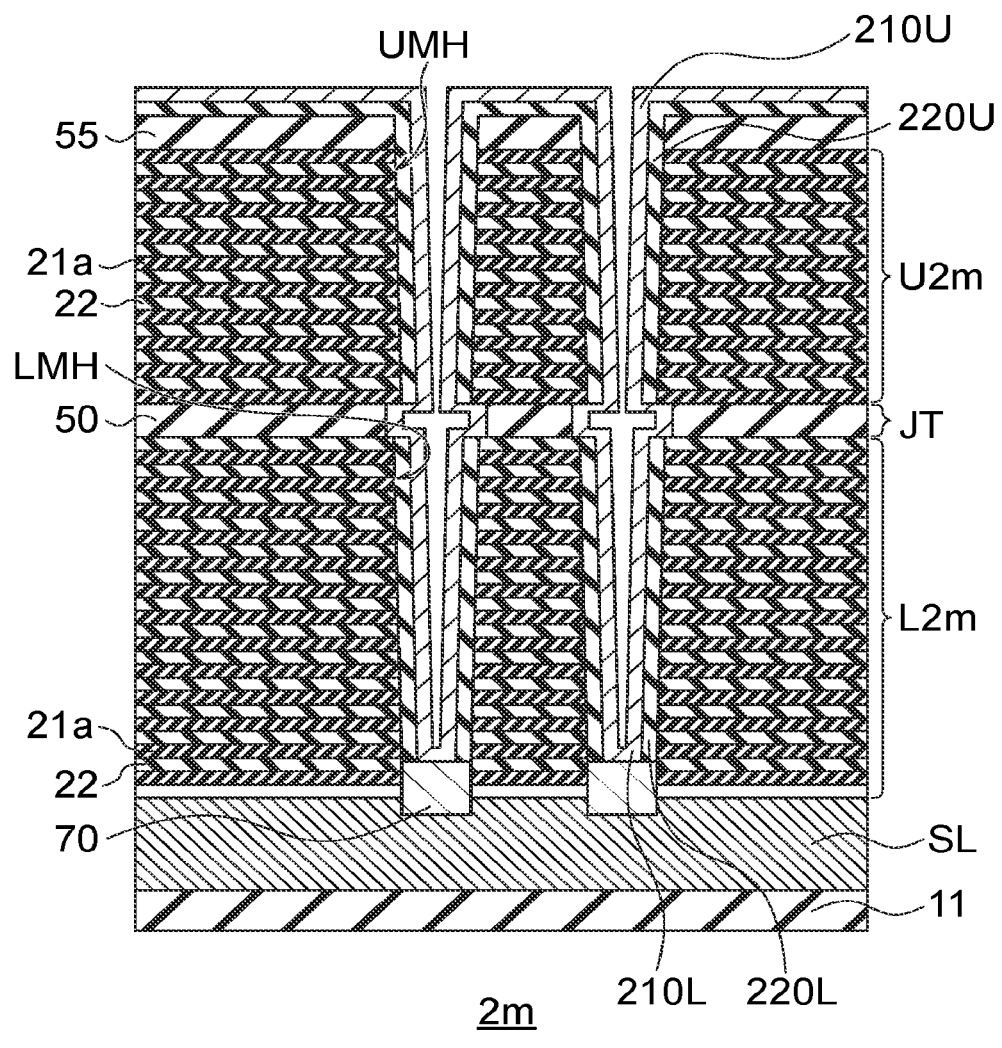

Next, as illustrated in FIG. 14, the semiconductor body 210U is formed in the upper memory hole UMH, and the semiconductor body 210L is formed in the lower memory hole LMH. The semiconductor body 210J as a third semiconductor layer is formed in a hole in the intermediate film 50 of the joint portion JT. The semiconductor bodies 210U, 210L, and 210J are formed by the same process. Therefore, the semiconductor body 210J is continuous with the semiconductor body 210U and the semiconductor body 210L therebetween and is made of the same material (for example, silicon) as the semiconductor bodies 210U and 210L.

Figure 15:
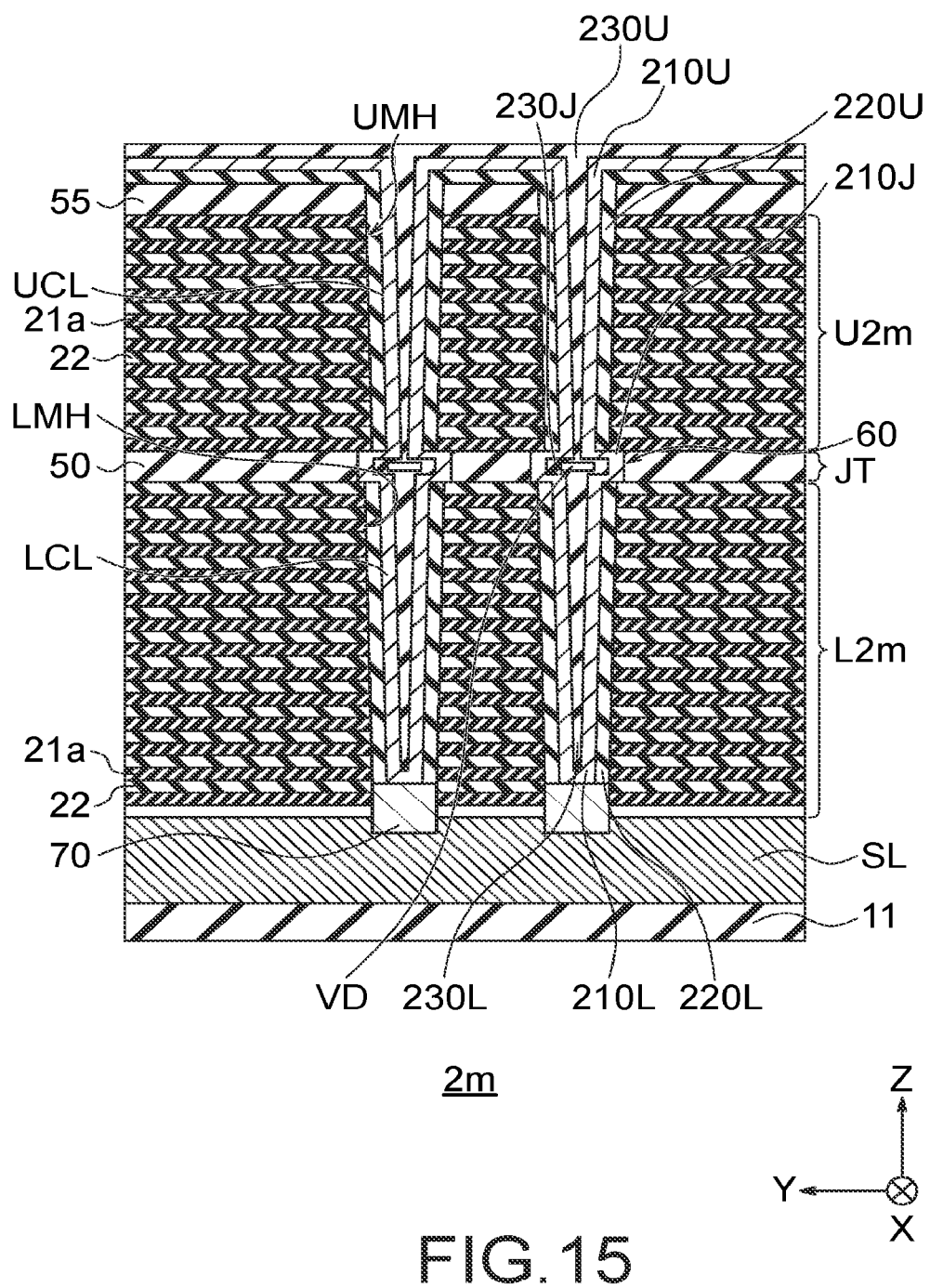

Next, as illustrated in FIG. 15, the core layers 230U and 230L are filled inside the semiconductor bodies 210U and 210L in the upper memory hole UMH and the lower memory hole LMH, respectively. Further, the core layer 230J is filled in the lower memory hole LMH in the intermediate film 50 of the joint portion JT. An insulating film, for example, a silicon oxide film is used as the core layers 230U, 230L, and 230J. Accordingly, the upper column portion UCL and the lower column portion LCL are formed in the upper memory hole UMH and the lower memory hole LMH, respectively. The connecting portion 60 is formed in the intermediate film 50 of the joint portion JT. The connecting portion 60 includes the semiconductor body 210J and the core layer 230J, but does not include the memory films 220U and 220L. The void VD is provided at the center of the core layer 230J of the connecting portion 60.

Next, the core layer 230U, the semiconductor body 210U, and the memory film 220U are polished by CMP (Chemical Mechanical Polishing) or the like until the insulation film 55 is exposed.

Next, although not illustrated, a trench is formed to penetrate through the stacks U2m and L2m. The sacrifice films 21a are then replaced with the electrode films 21 via the trench. A conductive material, for example, tungsten is used for the electrode films 21.

Thereafter, although not illustrated, an interlayer dielectric film, a contact, and a wiring layer (for example, the bit line BL) are formed. The semiconductor storage device according to the present embodiment is completed in this manner. The semiconductor storage device 100a may be formed by forming a CMOS circuit of the base portion 1 in another substrate and bonding a substrate with the stacks L2m and U2m and the substrate with the CMOS circuit to each other.

As described above, the connecting portion 60 does not include the memory film 220 around the semiconductor bodies 210U and 210L in the present embodiment. Accordingly, an electric field from the word line WL can be applied relatively easily, and increase of the on-resistance in the connecting portion 60 is suppressed. As a result, the cell current Icell can easily flow. Therefore, it is possible to correctly detect data of the memory cell MC.

Second Embodiment

Figure 16:
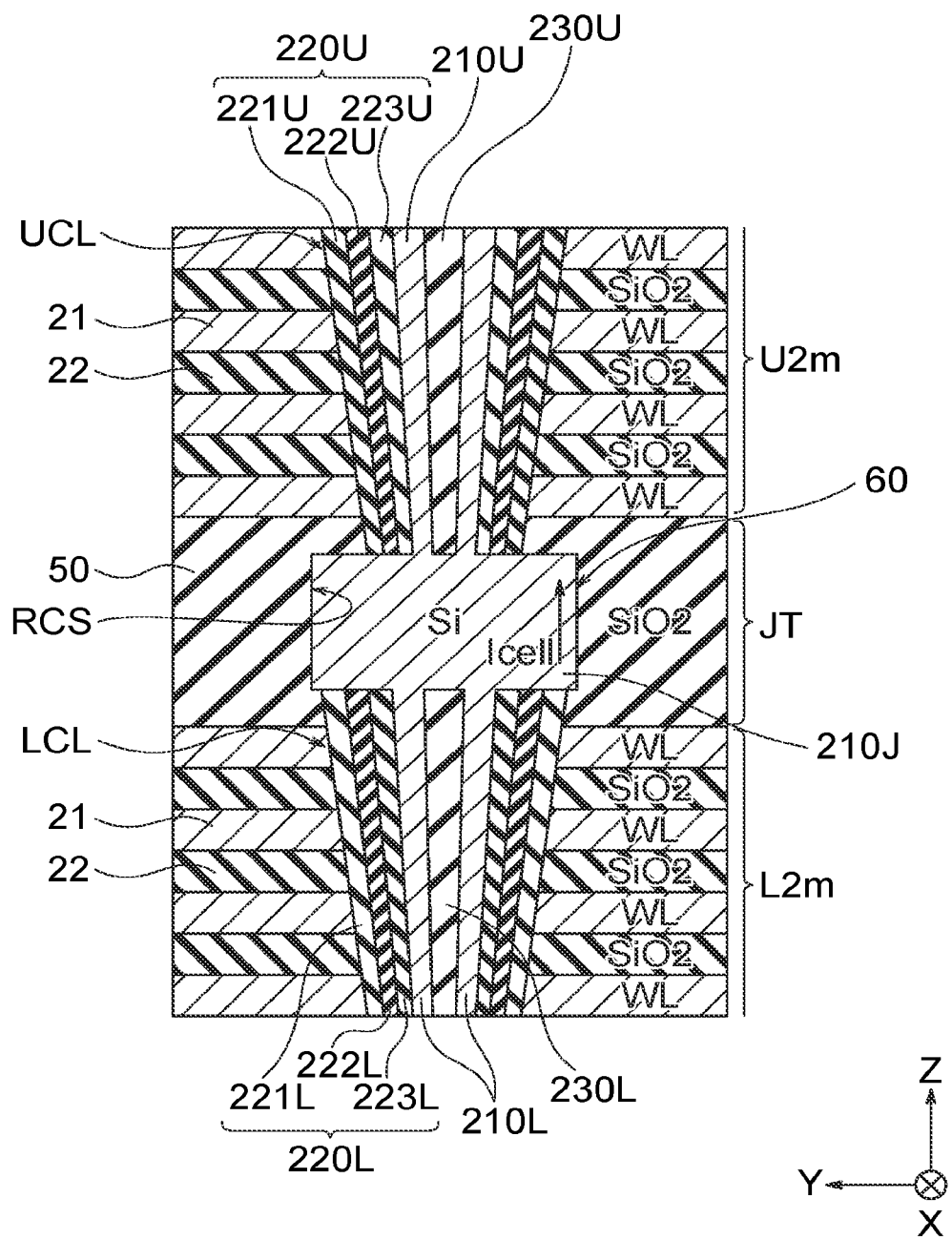
FIG. 16 is a cross-sectional view illustrating a configuration example of the joint portion between the upper array and the lower array according to a second embodiment.

FIG. 16 is a cross-sectional view illustrating a configuration example of the joint portion JT between the upper array U2m and the lower array L2m according to a second embodiment.

According to the second embodiment, the connecting portion 60 is provided between the semiconductor body 210U and the upper column portion UCL and the lower column portion LCL. The connecting portion 60 is embedded between the cover insulation film 221U and the cover insulation film 221L, between the charge storage film 222U and the charge storage film 222L, and between the tunnel insulation film 223U and the tunnel insulation film 223L. The whole inside of the connecting portion 60 is filled with a semiconductor material, for example, doped silicon, similarly to the material for the semiconductor bodies 210U and 210L. The core layer 230 and the void VD are not provided in the connecting portion 60. Accordingly, the resistance of the joint portion JT between the semiconductor body 210U and the semiconductor body 210L is further lowered, allowing the cell current Icell to flow more easily.

The rest of the configuration of the second embodiment may be identical to the corresponding one of the first embodiment. Therefore, the second embodiment can obtain effects identical to those of the first embodiment.

Next, a manufacturing method of a semiconductor storage device according to the second embodiment is described.

Figure 17:
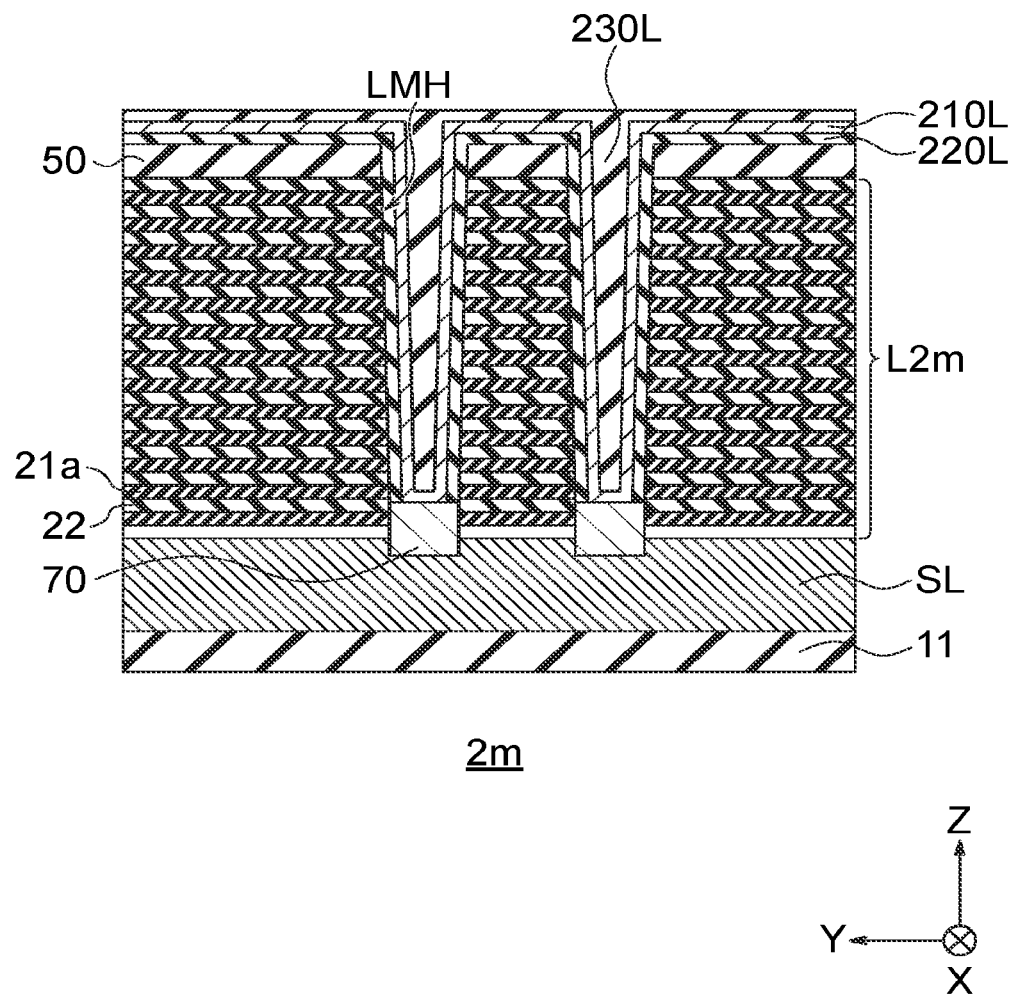
FIGS. 17 to 20 are cross-sectional views illustrating an example of the manufacturing method of the semiconductor storage device according to the second embodiment.

FIGS. 17 to 20 are cross-sectional views illustrating an example of the manufacturing method of the semiconductor storage device according to the second embodiment. After the processes described with reference to FIG. 6, the semiconductor body 210L is formed on the memory film 220L in the lower memory hole LMH. Next, the core layer 230L is filled inside the semiconductor body 210L in the lower memory hole LMH. With this process, the structure illustrated in FIG. 17 is obtained.

Figure 18:
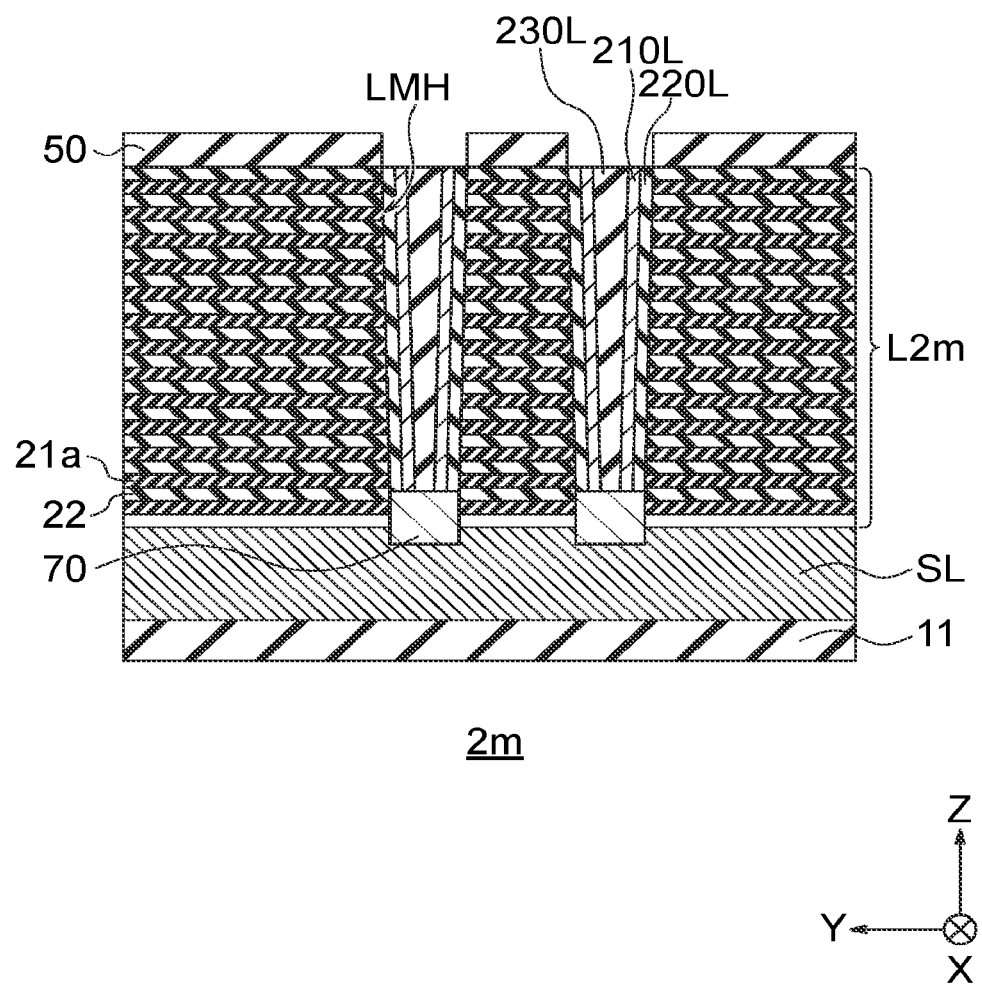

Next, the core layer 230L, the semiconductor body 210L, and the memory film 220L are polished by CMP or the like until the top surface of the intermediate film 50 is exposed. Further, the core layer 230L, the semiconductor body 210L, and the memory film 220L in the lower memory hole LMH in the intermediate film 50 are removed. With this process, the structure illustrated in FIG. 18 is obtained.

Figure 19:
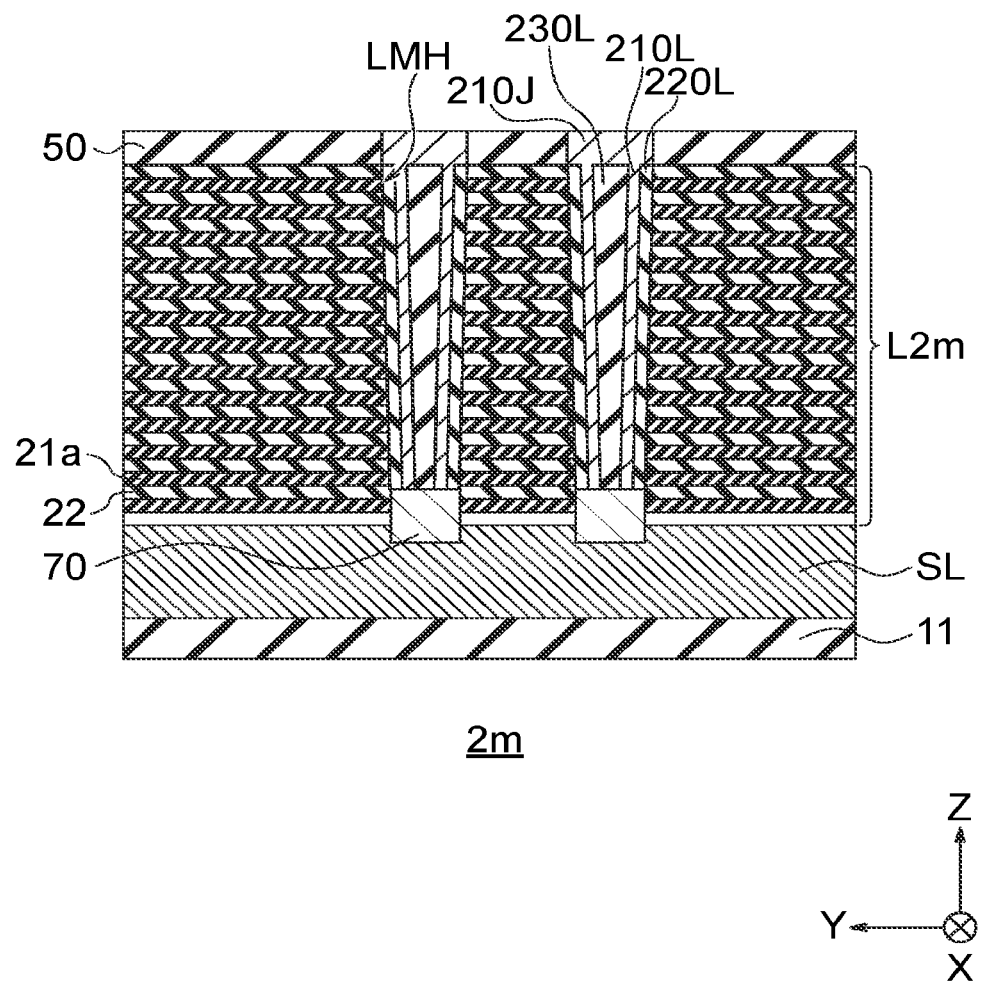
Figure 20:
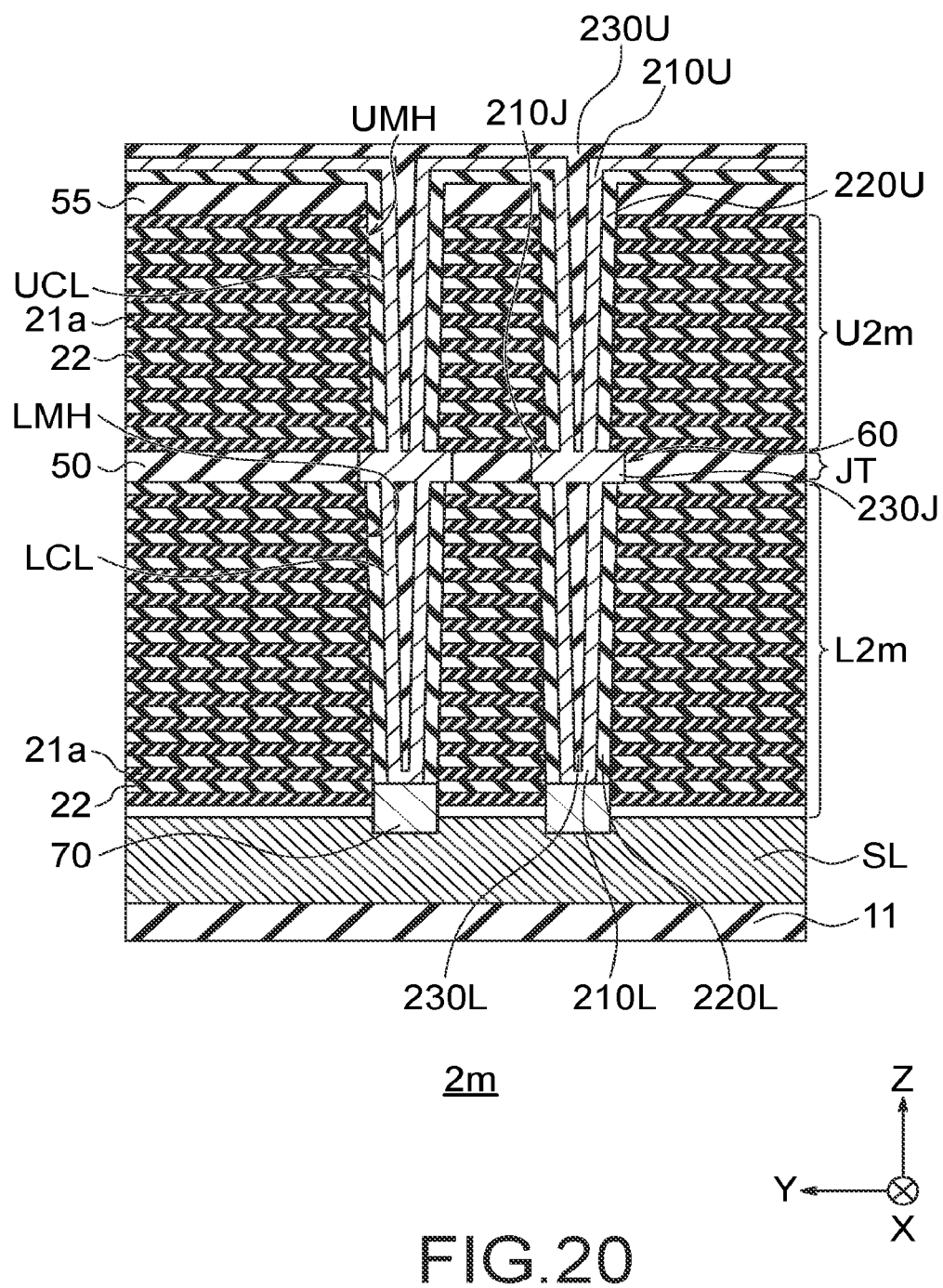

Next, the semiconductor body 210J is embedded in the lower memory hole LMH in the intermediate film 50. Subsequently, the semiconductor body 210J is polished by CMP or the like until the top surface of the intermediate film 50 is exposed. With this process, the structure illustrated in FIG. 19 is obtained. The semiconductor body 210J is electrically connected to the semiconductor body 210L. A semiconductor material, for example, doped polysilicon, which is the same as those for the semiconductor bodies 210L and 210U, is used for the semiconductor body 210J. Next, after the processes described with reference to FIG. 10, the stack U2m and the upper memory hole UMH are formed on the intermediate film 50. That is, the stack U2m including the sacrifice films 21a that are stacked in the Z-direction and separated from each other is formed on the intermediate film 50. Next, the upper memory hole UMH is formed in the stack U2m to extend in the Z-direction and reach the semiconductor body 210J. Subsequently, the memory film 220U and the semiconductor body 210U are formed on the inner wall of the upper memory hole UMH. The memory film 220U and the semiconductor body 210U at the bottom portion of the upper memory hole UMH are then removed, whereby the semiconductor body 210J is exposed. Next, the core layer 230U is embedded inside the semiconductor body 210U in the upper memory hole UMH. With this process, the structure illustrated in FIG. 20 is obtained.

Next, the core layer 230U, the semiconductor body 210U, and the memory film 220U are polished by CMP or the like until the top surface of the intermediate film 50 is exposed.

Next, although not illustrated, a trench is formed to penetrate through the stacks U2m and L2m. Next, the sacrifice films 21a are replaced with the electrode films 21 via the trench. A conductive material, for example, tungsten is used for the electrode films 21.

Thereafter, although not illustrated, an interlayer dielectric film, a contact, and a wiring layer (for example, the bit line BL) are formed. The semiconductor storage device according to the second embodiment is completed in this manner. The semiconductor storage device 100a may be formed by forming a CMOS circuit of the base portion 1 in another substrate and bonding a substrate with the stacks L2m and U2m and the substrate with the CMOS circuit to each other.

Third Embodiment

Figure 21:
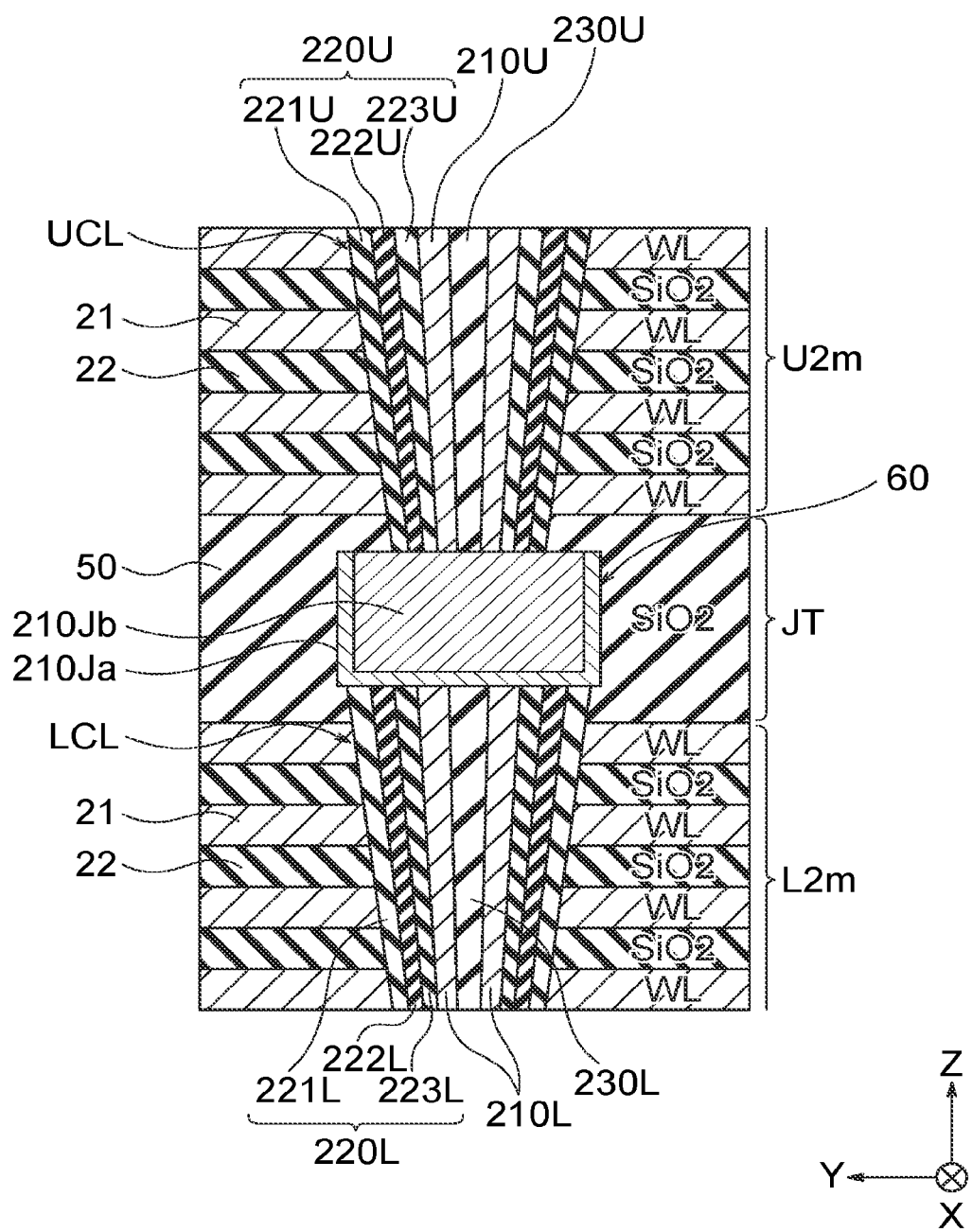
FIG. 21 is a cross-sectional view illustrating a configuration example of the joint portion between the upper array and the lower array of a semiconductor storage device according to a third embodiment.

FIG. 21 is a cross-sectional view illustrating a configuration example of the joint portion JT between the upper array U2m and the lower array L2m of a semiconductor storage device according to a third embodiment.

The third embodiment is different from the second embodiment in that the connecting portion 60 is made of a conductive metal material. In the third embodiment, the connecting portion 60 includes metal films 210Ja and 210Jb. The metal film 210Ja covers a side surface and a bottom surface of the metal film 210Jb. For example, the metal film 210Ja is a barrier metal and is made of a metal, for example, TiN. The metal film 210Jb is a conductive metal material embedded inside the metal film 210Ja and is made of a metal, for example, tungsten.

The connecting portion 60 is provided between the upper column portion UCL and the lower column portion LCL in the joint portion JT. The connecting portion 60 is embedded between the cover insulation film 221U and the cover insulation film 221L, between the charge storage film 222U and the charge storage film 222L, and between the tunnel insulation film 223U and the tunnel insulation film 223L. That is, the whole inside of the connecting portion 60 is filled with a conductive metal material. The core layer 230 and the void VD are not provided in the connecting portion 60. Accordingly, the resistance of the joint portion JT between the semiconductor body 210U and the semiconductor body 210L is further lowered, allowing the cell current Icell to flow more easily.

The rest of the configuration of the third embodiment may be identical to the corresponding one of the second embodiment. Therefore, the third embodiment can obtain effects identical to those of the second embodiment.

In a manufacturing method of a semiconductor storage device according to the third embodiment, it suffices that the metal films 210Ja and 210Jb are formed in place of the semiconductor body 210J (for example, made of doped silicon) illustrated in FIG. 19 in the manufacturing method according to the second embodiment. The rest of the manufacturing method of the third embodiment may be identical to that of the second embodiment.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor storage device comprising:
a first stack including a plurality of first electrode films stacked in a first direction and electrically isolated from each other;
a second stack provided above the first stack and including a plurality of second electrode films that are stacked in the first direction and are electrically isolated from each other;
a first column portion provided in the first stack to extend in the first direction and including a first insulation film, a first charge storage film, a second insulation film, and a first semiconductor layer;
a second column portion provided in the second stack to extend in the first direction and including a third insulation film, a second charge storage film, a fourth insulation film, and a second semiconductor layer; and
a connecting portion provided between the first column portion and the second column portion, dividing the first insulation film and the third insulation film from each other, the first charge storage film and the second charge storage film from each other, and the second insulation film and the fourth insulation film from each other all over the first and second column portions, and configured to electrically connect the first semiconductor layer and the second semiconductor layer to each other, wherein
the connecting portion has a part of a semiconductor body projecting in a second direction perpendicular to the first direction,
the semiconductor body is made of a same material as the first and second semiconductor layers and is formed as one continuous semiconductor layer with the first and second semiconductor layers,
the semiconductor body is provided at an outermost side of the connecting portion and directly contacts with a sixth insulation film provided between the first stack and the second stack,
a first distance in the first direction between a bottom surface of the connecting portion and a top surface of a topmost electrode film of the first electrode films is smaller than a second distance in the second direction between an outer surface of the first semiconductor layer and a surface facing toward the first semiconductor layer of the topmost electrode film, and
a third distance in the first direction between a top surface of the connecting portion and a bottom surface of a bottommost electrode film of the second electrode films is smaller than a fourth distance in the second direction between an outer surface of the second semiconductor layer and a surface facing toward the second semiconductor layer of the bottommost electrode film.

2. The device of claim 1, wherein the semiconductor body is configured to electrically connect the first semiconductor layer and the second semiconductor layer to each other and provided between the first insulation film and the third insulation film, between the first charge storage film and the second charge storage film, and between the second insulation film and the fourth insulation film.

3. The device of claim 2, further comprising a fifth insulation film provided inside the semiconductor body, the fifth insulation film having a void therein.

4. The device of claim 3, wherein the sixth insulation film is provided between the first column portion and the second column portion, wherein
the semiconductor body and the fifth insulation film project in the sixth insulation film perpendicularly to the first direction.

5. The device of claim 2, wherein, in the connecting portion, the semiconductor body is embedded between the first insulation film and the third insulation film, between the first charge storage film and the second charge storage film, and between the second insulation film and the fourth insulation film.

6. The device of claim 1, wherein the first column portion, the second column portion, and the connecting portion are circular in plan view as viewed from the first direction.

7. The device of claim 1, wherein the connecting portion does not have the first and second charge storage films on the outermost side thereof.

8. The device of claim 1, wherein the first and second charge storage films are not provided between the semiconductor body of the connecting portion and the sixth insulation film.

* * * * *